(12) United States Patent
Park et al.

(10) Patent No.: US 12,039,897 B2
(45) Date of Patent: Jul. 16, 2024

(54) DISPLAY DEVICE THAT PREVENTS EDGE BURN-IN

(71) Applicant: LG Display Co., Ltd., Seoul (KR)

(72) Inventors: Geondo Park, Paju-si (KR); ChangHoon Lee, Seoul (KR); HwaDong Han, Goyang-si (KR); Yeolhyeong Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 354 days.

(21) Appl. No.: 17/410,093

(22) Filed: Aug. 24, 2021

(65) Prior Publication Data

US 2022/0108635 A1    Apr. 7, 2022

(30) Foreign Application Priority Data

Oct. 6, 2020    (KR) .......................... 10-2020-0128935

(51) Int. Cl.
*G09F 9/30*  (2006.01)
*H10K 50/84*  (2023.01)
*H10K 59/122*  (2023.01)
*H10K 59/131*  (2023.01)
*H10K 102/00*  (2023.01)
*H10K 102/10*  (2023.01)

(52) U.S. Cl.
CPC ............. *G09F 9/301* (2013.01); *H10K 50/84* (2023.02); *H10K 59/122* (2023.02); *H10K 59/131* (2023.02); *H10K 2102/102* (2023.02); *H10K 2102/103* (2023.02); *H10K 2102/311* (2023.02)

(58) Field of Classification Search
CPC ............................ G09F 9/301; H10K 59/131; H10K 2102/311; H10K 2102/102; H10K 2102/103; H01K 59/122; H01K 50/84
USPC .......................................................... 257/40
See application file for complete search history.

(56) References Cited

U.S. PATENT DOCUMENTS

2017/0329162 A1*  11/2017  Yamazaki ............ H10K 77/111
2020/0203642 A1*  6/2020   Kim ...................... B32B 15/043

FOREIGN PATENT DOCUMENTS

KR    10-2017-0123949 A    11/2017

* cited by examiner

*Primary Examiner* — Xia L Cross
(74) *Attorney, Agent, or Firm* — Seed IP Law Group LLP

(57) ABSTRACT

A display device includes a display panel having a display area and a non-display area and a polyimide substrate. The display device includes a transistor disposed above the substrate in the display area, a flexible film disposed on a side surface of the non-display area and connected to the substrate, and a conductive layer disposed below the substrate and applied with a low potential power voltage from the flexible film to improve an edge burn-in due to the polarization by offsetting positive charges in the polyimide substrate.

20 Claims, 19 Drawing Sheets

| HOUR | COMPARATIVE EMBODIMENT 1 | | | | EXPERIMENTAL EXAMPLE 1 | | | | EXPERIMENTAL EXAMPLE 2 | | | |
|---|---|---|---|---|---|---|---|---|---|---|---|---|
| | EDGE | INSIDE | ΔVth | EDGE | EDGE | INSIDE | ΔVth | EDGE | EDGE | INSIDE | ΔVth | EDGE |
| 0 | -0.2 | -0.4 | 0.2 | NONE | 0.4 | 0.4 | 0 | NONE | 0 | 0 | 0 | NONE |
| 30 MINUTES | | | | | -0.2 | -0.2 | 0 | NONE | 0 | 0 | 0 | NONE |
| 1 HOUR | -0.5 | -1 | 0.5 | LEVEL 1 (DARK) | | | | | | | | |
| Δ | -0.3 | -0.6 | 0.3 | DEFECT | -0.6 | -0.6 | 0 | NONE | 0 | 0 | 0 | NONE |

FIG. 14 ns of a display
DISPLAY DEVICE THAT PREVENTS EDGE BURN-IN

CROSS-REFERENCE TO RELATED APPLICATIONS

This application claims the priority of Korean Patent Application No. 10-2020-0128935 filed on Oct. 6, 2020, in the Korean Intellectual Property Office, the entire disclosure of which is incorporated herein by reference.

BACKGROUND

Technical Field

The present disclosure relates to a display device, and more particularly, to a display device with a flexible substrate.

Description of the Related Art

Display devices used for a monitor of a computer, a television, or a cellular phone include an organic light emitting display (OLED) apparatus which is a self-emitting device, a liquid crystal display (LCD) apparatus which requires a separate light source, and the like.

An applicable range of the display device is diversified to personal digital assistants as well as monitors of computers and televisions and a display device with a large display area and a reduced volume and weight is being studied.

Recently, a flexible display device is getting attention as a next generation display device.

BRIEF SUMMARY

An object to be achieved by the present disclosure is to provide a display device which improves edge burn-in in a flexible display device based on a polyimide PI substrate.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel which is divided into a display area and a non-display area and includes a substrate, a transistor which is disposed above the substrate and is provided in the display area, a flexible film which is disposed on a side surface of the non-display area and is connected to the substrate and a conductive layer which is disposed below the substrate and is applied with a low potential power voltage from the flexible film.

Other detailed matters of the embodiments are included in the detailed description and the drawings.

According to the present disclosure, the flexible display device may be manufactured by forming a display element and a wiring line on a flexible substrate which is formed of a plastic material such as polyimide (PI), which is a flexible material. In a flexible display device based on the polyimide (PI) substrate, positive charges in the polyimide substrate are offset to improve the edge burn-in due to the polarization.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which:

FIG. 14 is a table illustrating an evaluation result during the initial driving.

DETAILED DESCRIPTION

Figure 1A:
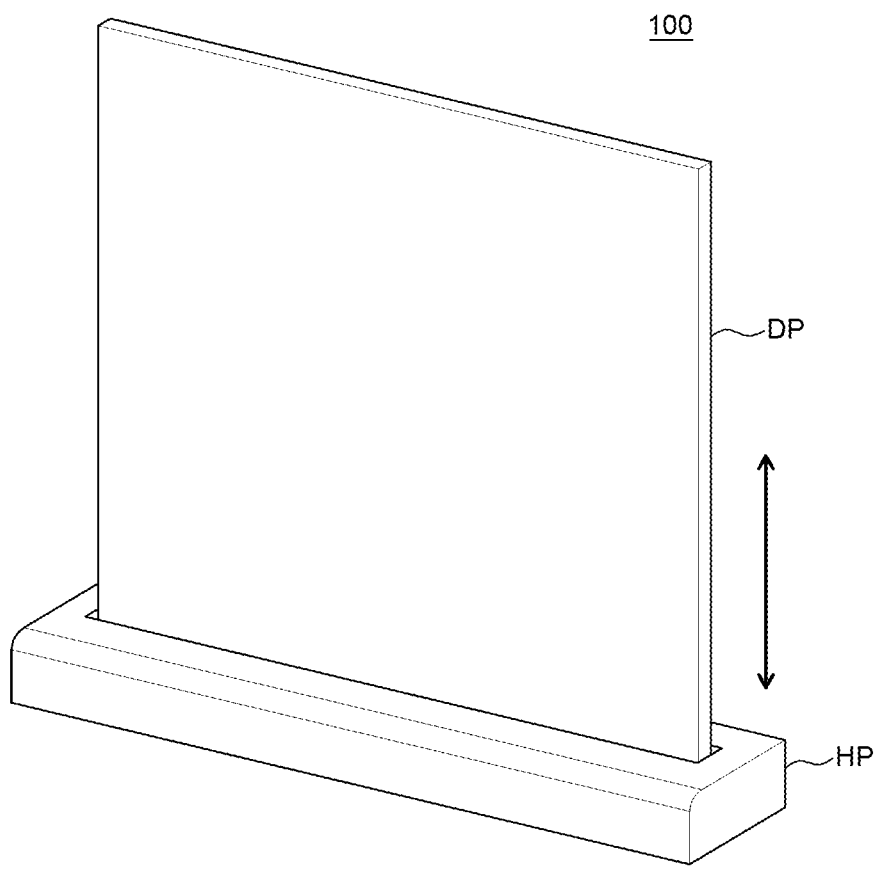
FIGS. 1A and 1B are perspective views of a display device according to a first embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly." Further, the terms "above" and "below" may refer to the orientation or position of aspects of the disclosure according to the orientation shown in the illustrated embodiments. Thus, although two parts may be described as being "above" or "below" each other in the orientation shown in the illustrated embodiments, the present disclosure also contemplates the two parts being in front of, behind, to the left or to the right of each other depending on the orientation of the embodiments in use.

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to accompanying drawings.

A rollable display device may also be referred to as a display device which is capable of displaying images even though the display device is rolled. The rollable display device may have a high flexibility as compared with a general display device of the related art. A shape of the rollable display device may freely vary depending on whether the rollable display device is in use. Specifically, when the rollable display device is not in use, the rollable display device is rolled to be stored with a reduced volume. In contrast, when the rollable display device is in use, the rolled rollable display device is unrolled to be used.

However, the present disclosure is not limited to a rollable display device, and may be applied to any plastic-based flexible display device such as a foldable display device. However, hereinafter, for convenience of description, a rollable display device will be exemplified as a display device.

Figure 1B:
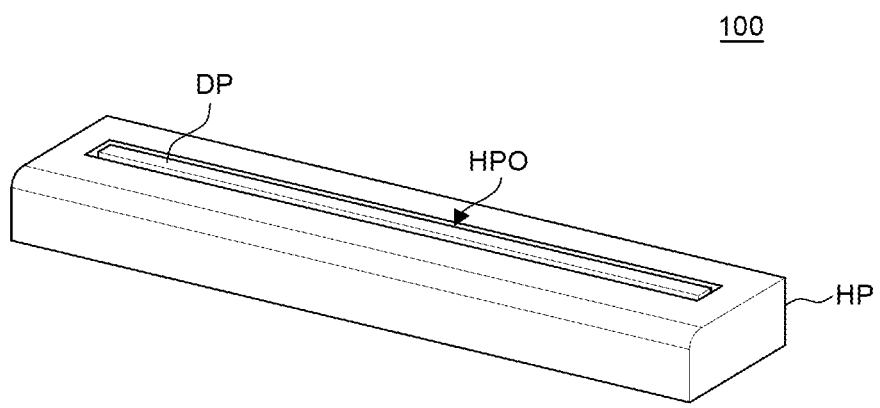

FIGS. 1A and 1B are perspective views of a display device according to a first embodiment of the present disclosure.

Referring to FIGS. 1A and 1B, a display device 100 according to a first embodiment of the present disclosure includes a display unit DP (which may also be referred to herein as a display assembly DP) and a housing unit HP (which may also be referred to herein as a housing HP).

The display unit DP is a configuration for displaying images to a user and for example, in the display unit DP, a display element and a circuit, a wiring line, a component, and the like for driving the display element may be disposed.

As described above, the display device 100 according to the first embodiment of the present disclosure is a rollable display device 100 and the display unit DP may be configured to be wound and unwound. For example, the display unit DP according to the first embodiment of the present disclosure may be formed of a display panel and a back cover each having a flexibility to be wound or unwound. The display unit DP, the display panel, and the back cover will be described below in more detail with reference to FIGS. 2 and 3.

The housing unit HP is a case in which the display unit DP is accommodated. The display unit DP may be wound to be accommodated in the housing unit HP and the display unit DP may be unwound to be disposed at the outside of the housing unit HP or extending from the housing unit HP.

The housing unit HP has an opening HPO to allow the display unit DP to move to the inside and the outside of the housing unit HP. The display unit DP may move in a vertical direction by passing through the opening HPO of the housing unit HP.

The display unit DP of the display device 100 may be switched from a fully unwound state to a fully wound state or from a fully wound state to a fully unwound state.

FIG. 1A illustrates the display unit DP of the display device 100 which is fully unwound as an example. In the fully unwound state, the display unit DP of the display device 100 is disposed at the outside of the housing unit HP. That is, in order for a user to watch images on the display device 100, the display unit DP is unwound to extend from the housing unit HP as much as possible and cannot be further unwound, which may be defined as a fully unwound state.

FIG. 1B illustrates the display unit DP of the display device 100 which is fully wound as an example. In the fully wound state, the display unit DP of the display device 100 is accommodated in the housing unit HP and cannot be further wound. That is, when the user does not watch images on the display device 100, it is advantageous from the viewpoint of an outer appearance that the display unit DP is not disposed at the outside of the housing unit HP. Therefore, the fully wound state may be defined as when the display unit DP is wound to be accommodated in the housing unit HP.

When the display unit DP is in a fully wound state to be accommodated in the housing unit HP, a volume of the display device 100 is reduced and the display device 100 may be easily carried.

In order to switch the display unit DP to a fully unwound state or a fully wound state, the display device 100 may include a driving unit (which may also be referred to herein as a drive assembly) which winds or unwinds the display unit DP.

Figure 2:
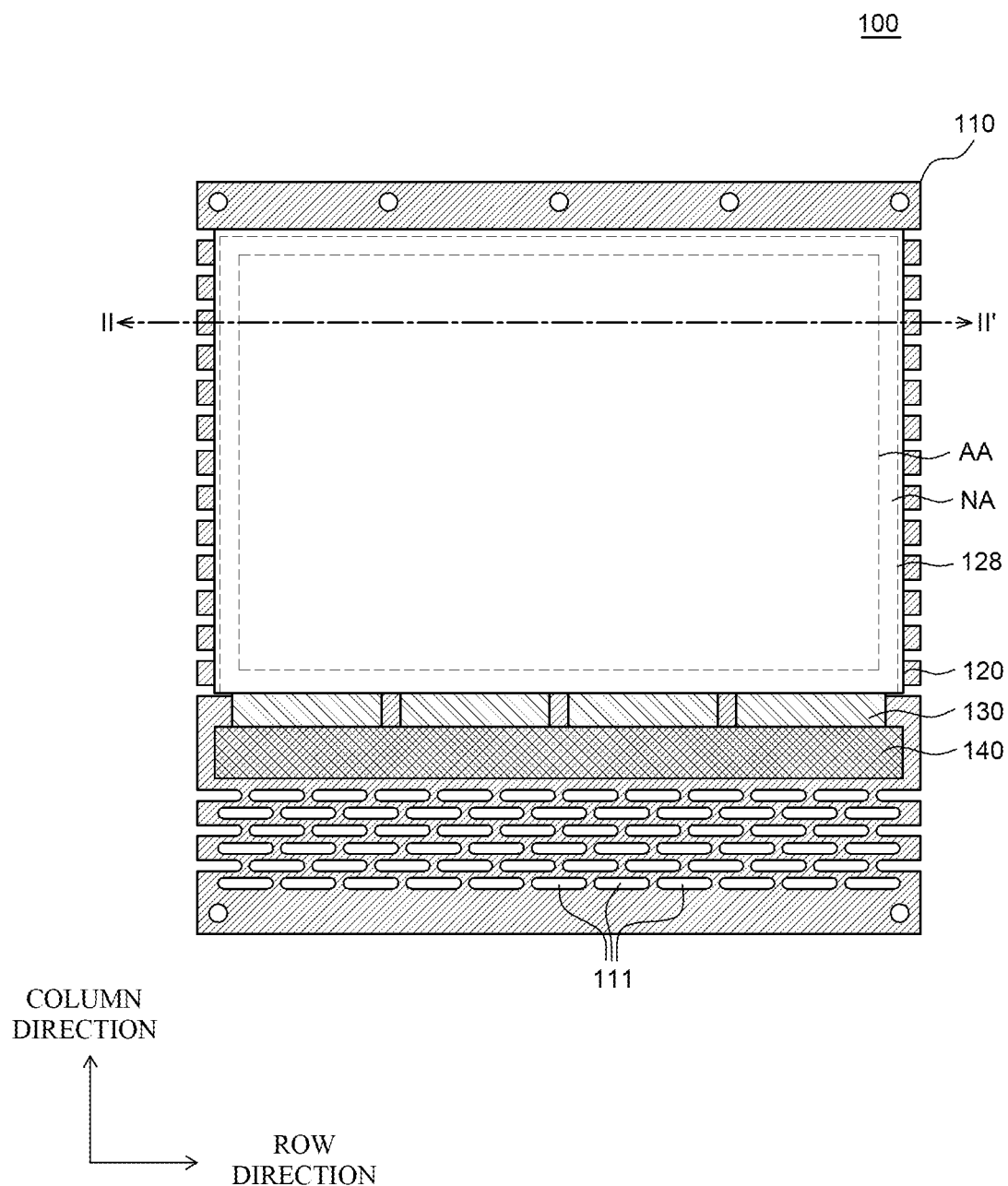
FIG. 2 is a plan view of the display device of FIG. 1.

FIG. 2 is a plan view of a display device according to the first embodiment of the present disclosure.

Figure 3:
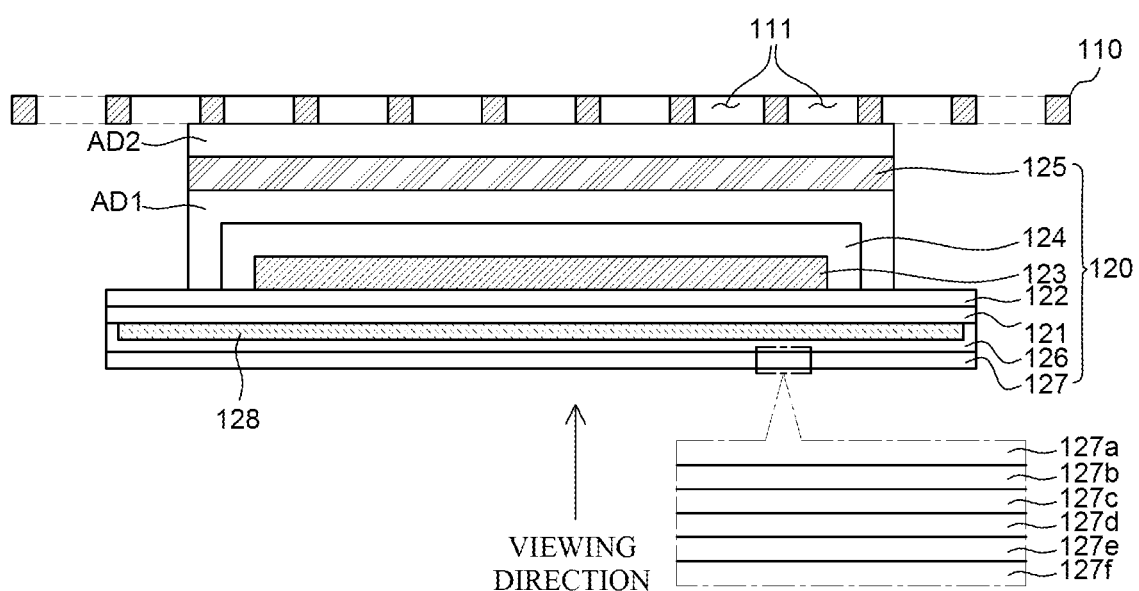
FIG. 3 is a cross-sectional view of the display device of FIG. 2 taken along the line II-II' of FIG. 2.

FIG. 3 is a cross-sectional view of the display device taken along the line II-II' of FIG. 2.

Referring to FIGS. 2 and 3, the display unit DP according to the first embodiment of the present disclosure includes a back cover 110, a display panel 120, a flexible film 130, and a printed circuit board 140.

The display panel 120 is a panel for displaying images to a user.

The display panel 120 may include a display element which displays images, a driving element which drives the display element, and wiring lines which transmit various signals to the display element and the driving element. The display element may be defined in different ways depending on a type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. The following description assumes that the display panel 120 is an organic light emitting display panel, but the display panel 120 is not limited to the organic light emitting display panel and the concepts of the present disclosure may be applied equally to liquid crystal display panels as well as other types of display panels. Further, since the display device 100 according to the first embodiment of the present disclosure is a rollable display device, the display panel 120 may be implemented as a flexible display panel to be wound around or unwound from a roller 151.

The display panel 120 includes a display area AA and a non-display area NA.

The display area AA is an area where images are displayed in the display panel 120.

The display area AA may include a plurality of pixels having a plurality of sub pixels as well as a circuit for driving the plurality of sub pixels. The plurality of sub pixels are minimum units which configure the display area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but the present disclosure is not limited thereto. Further, a circuit for driving the plurality of sub pixels may include a driving element, a wiring line, and the like. For example, the circuit may be configured by a thin film transistor, a storage capacitor, a gate line, a data line, and the like, but is not limited thereto.

The non-display area NA is an area where no image is displayed.

In the non-display area NA, various wiring lines, circuits, and the like for driving the organic light emitting diode of the display area AA are disposed. For example, in the non-display area NA, a link line which transmits signals to the plurality of sub pixels and circuits of the display area AA, a driving integrated circuit ("IC") such as a gate driver IC or a data driver IC, or the like may be disposed, but the present disclosure is not limited thereto.

The flexible film 130 is a film including various components disposed on a base film having a malleability. Specifically, the flexible film 130 is a film which supplies a signal to the plurality of sub pixels and the circuits of the display area AA and is electrically connected to the display panel 120. The flexible film 130 is disposed at one end of the non-display area NA of the display panel 120 to supply a power voltage, a data voltage, or the like, to the plurality of sub pixels and the circuits of the display area AA. Even though four flexible films 130 are illustrated in FIG. 2, the number of flexible films 130 may vary depending on the design and is not limited thereto.

In some embodiments, a driving IC such as a gate driver IC or a data driver IC may be disposed on the flexible film 130. The driving IC is a component which processes data for displaying images and a driving signal for processing the data. The driving IC may be disposed by a chip on glass (COG), a chip on film (COF), a tape carrier package (TCP), or the like depending on a mounting method. However, for the convenience of description, it is described that the driving IC is mounted on the flexible film 130 by a chip on film manner, but is not limited thereto.

The printed circuit board 140 is disposed at one end of the flexible film 130 and connected to the flexible film 130. The printed circuit board 140 is a component which supplies signals to the driving IC. The printed circuit board 140 supplies various signals such as a driving signal or a data signal to the driving IC. For example, a data driver which generates data signals may be mounted in or on the printed circuit board 140 and the generated data signal may be supplied to the plurality of sub pixels and the circuit of the display panel 120 through the flexible film 130. In the meantime, even though one printed circuit board 140 is illustrated in FIG. 2, the present disclosure is not limited thereto and the number of printed circuit boards 140 may vary depending on the design.

The back cover 110 is disposed on rear surfaces of the display panel 120, the flexible film 130, and the printed circuit board 140 to support the display panel 120, the flexible film 130, and the printed circuit board 140. Therefore, a size of the back cover 110 may be larger than a size of the display panel 120. Therefore, the back cover 110 may protect other configurations of the display unit DP from the outside or from a rear side. Even though the back cover 110 is formed of a material having a rigidity, at least a part of the back cover 110 may have a flexibility to be wound or unwound together with the display panel 120. For example, the back cover 110 may be formed of a metal material such as steel use stainless SUS or invar or plastic. The material of the back cover 110 is not limited to the above illustrative examples and may be formed of various materials with preferred physical conditions such as a thermal strain amount, a radius of curvature, and a rigidity.

In the meantime, a conductive layer 128 may be disposed below a substrate 121 (FIG. 4) of the display panel 120.

The conductive layer 128 may be disposed below the substrate 121 to suppress an edge burn-in at an edge area EA (FIG. 4) of the display panel 120.

The conductive layer 128 may be formed inwardly from the edge of the substrate 121 by a predetermined or selected distance, on three surfaces of the display panel 120 except for a lower portion of the display panel 120 on which the flexible film 130 is disposed, but is not limited thereto. In some non-limiting examples, the conductive layer 128 may be formed on all sides or surfaces of the display panel, on only three sides or surfaces of the display panel 120, on only two sides or surfaces of the display panel 120, or on only one side or surface of the display panel 120. Further, the sides or surfaces of the display panel 120 that include the conductive layer 128 may be selected to be any side or surface of the display panel 120.

Referring to FIG. 3, the display panel 120 includes a substrate 121, a buffer layer 122, a pixel unit 123 (which may also be referred to herein as a pixel assembly 123), an encapsulation layer 124, an encapsulation substrate 125, a barrier film 126, and a polarizing plate 127.

The substrate 121 is a base member which supports various components of the display panel 120 and may be configured by or include an insulating material. The substrate 121 may be formed of a material having a flexibility to allow the display panel 120 to be wound or unwound and for example, may be formed of a plastic material such as polyimide (PI) or other like materials that allow the display panel 120 to be wound or unwound.

The buffer layer 122 may suppress moisture and/or oxygen which permeates from the outside of the substrate 121 from being spread through the display panel 120. The buffer layer 122 may be configured by a single layer or a double layer of silicon oxide SiOx and silicon nitride SiNx, but is not limited thereto.

The pixel unit 123 includes a plurality of organic light emitting diodes and a pixel driving circuit for driving the organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. When the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group consisting of metals, such as magnesium (Mg), silver (Ag), and aluminum (Al), and an alloy thereof, but is not limited thereto.

The display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material and the cathode may be formed of the metal material having a high reflectance to allow the light emitted from the organic light emitting diode to travel to the lower portion of the substrate 121.

In the following description, it is assumed for convenience that the display device 100 according to a first embodiment of the present disclosure is a bottom emission type display device, but the present disclosure is not limited thereto and the concepts of the present disclosure may be applied equally to top emission type display devices.

A circuit for driving the organic light emitting diode is disposed in the pixel unit 123. The circuit may be formed of a thin film transistor, a storage capacitor, a gate line, a data line, a power line, and the like, and the circuit may have various forms depending on the design of the display device 100.

The encapsulation layer 124 which covers the pixel unit 123 is disposed above the pixel unit 123. The encapsulation layer 124 seals the organic light emitting diode of the pixel unit 123. The encapsulation layer 124 may protect the organic light emitting diode of the pixel unit 123 from moisture, oxygen, impacts, and other external forces or contaminants. The encapsulation layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but the composition of the layers is not limited thereto.

The encapsulation substrate 125 is disposed above the encapsulation layer 124. The encapsulation substrate 125 protects the organic light emitting diode of the pixel unit 123 together with the encapsulation layer 124. The encapsulation substrate 125 may protect the organic light emitting diode of the pixel unit 123 from moisture, oxygen, and impacts, as well as other external forces or contaminants. The encapsulation substrate 125 may be formed of a metal material, which has a high corrosion resistance and is in the form of a foil or a thin film, such as aluminum (Al), nickel (Ni), chromium (Cr), and an alloy material of iron (Fe) and nickel. Therefore, as the encapsulation substrate 125 is formed of a metal material, the encapsulation substrate 125 may be implemented by an ultra-thin film and have a high resistance against external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 is formed of a material having adhesiveness or adhesive properties and may be a thermosetting or natural curable type adhesive. For example, the first adhesive layer AD1 may be formed of an optical clear adhesive (OCA), a pressure sensitive adhesive (PSA), or the like, but is not limited thereto.

In some embodiments, the first adhesive layer AD1 may be disposed so as to enclose the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting diode of the pixel unit 123 from moisture, oxygen, impacts, and other external forces and contaminants together with the encapsulation layer 124 and the encapsulation substrate 125. The first adhesive layer AD1 may further include an absorbent. The absorbent may be particles having hygroscopicity that absorb moisture and oxygen in the display panel to minimize permeation of the moisture and oxygen into the pixel unit 123.

The barrier film 126 is disposed below the substrate 121. The barrier film 126 may protect the display panel 120 from impacts, moisture, heat, and other external forces and contaminants. The barrier film 126 may be configured by polymer resin having a characteristic which is light and unbreakable or which has a high resistance to breaking. For example, the barrier film 126 may be configured by cyclo olefin polymer (COP), but is not limited thereto and may also be configured by a material such as polyimide (PI), poly carbonate (PC), and polyethylene terephthalate (PET).

The conductive layer 128 may be interposed between the substrate 121 and the barrier film 126.

The conductive layer 128 may be disposed below the substrate 121 to suppress an edge burn-in at an edge area EA (FIG. 4) of the display panel 120.

The conductive layer 128 may be formed inwardly from the edge of the substrate 121 by a predetermined or selected distance, on three surfaces except for a lower portion on which the flexible film 130 is disposed, but is not limited thereto. The conductive layer 128 will be described in more detail below with reference to FIGS. 4 to 8.

The polarizing plate 127 (which may also be referred to herein as a polarization plate 127) is disposed on a rear surface of the barrier film 126 or below the barrier film 126.

The polarizing plate 127 suppresses external light incident onto the display device 100 from being reflected such that it is visible to a user viewing the display panel 120. For example, the polarizing plate 127 includes a surface layer 127f, a first protective layer 127e, a polarization layer 127d, a second protective layer 127c, a phase retardation layer 127b, and an adhesive layer 127a.

The surface layer 127f is disposed at the outermost side of the polarizing plate 127 or a side of the polarizing plate 127 facing the viewing direction indicated in FIG. 3 to enhance a mechanical strength of the polarizing plate 127 and suppress the glare and reflection so that the visibility of the display device 100 may be improved. The surface layer 127f may be formed with a layer or a film formed by a surface processing method such as anti-glare AG, semi glare SG, low reflection LR, and anti-glare and low reflection AGLR, but is not limited thereto.

The adhesive layer 127a is disposed on an uppermost or innermost side of the polarizing plate 127 furthest from the surface layer 127f to bond the polarizing plate 127 to the barrier film 126. The adhesive layer 127a may be formed of a pressure sensitive adhesive (PSA), but is not limited thereto.

The phase retardation layer 127b may have a transmission axis of −45 degrees or +45 degrees with respect to an angle at which external light is polarized by the polarization layer 127d. Therefore, external light which is incident onto the phase retardation layer 127b passes through the phase retardation layer 127b to be circularly polarized.

The polarization layer 127d may linearly polarize light incident from the outside of the display device 100. Therefore, the polarization layer 127d may be formed of an oriented film of polyvinyl alcohol (PVA)-based polymer film containing iodine or dichroic dye, but is not limited thereto.

The first protective layer 127e and the second protective layer 127c may be disposed on both surfaces of the polarization layer 127d. The polarization layer 127d is formed of a polyvinyl alcohol-based material which absorbs moistures so that the first protective layer 127e and the second protective layer 127c are disposed on both surfaces of the polarization layer 127d. Therefore, the damage of the polarization layer 127d due to heat or moisture may be suppressed. The first protective layer 127e and the second protective layer 127c may be formed of a material having no phase difference so as not to affect the polarized state of the polarization layer 127d. For example, the first protective layer 127e and the second protective layer 127c may be formed of a material such as triacetyl cellulose TAC, but is not limited thereto.

The back cover 110 may be disposed above the encapsulation substrate 125. The back cover 110 is disposed to be in contact with the encapsulation substrate 125 of the display panel 120 to protect the display panel 120. In order to protect the display panel 120, the back cover 110 may be formed of a material having a rigidity.

In the meantime, the back cover 110 may include a plurality of openings 111.

The plurality of openings 111 may allow the back cover 110 to have a flexibility. The plurality of openings 111 may be flexibly deformed and allow the back cover 110 to be wound around the roller or unwound from the roller together with the display panel 120.

A second adhesive layer AD2 may be disposed between the encapsulating substrate 125 and the back cover 110. The second adhesive layer AD2 may bond the encapsulation substrate 125 and the back cover 110 to each other. The second adhesive layer AD2 is formed of a material having adhesiveness or adhesive properties and may be a thermosetting or natural curable type adhesive. For example, the second adhesive layer AD2 may be formed of an optical clear adhesive (OCA), a pressure sensitive adhesive (PSA), or the like, but is not limited thereto.

Even though in FIG. 3, it is illustrated that the plurality of openings 111 of the back cover 110 is not filled with the second adhesive layer AD2, the second adhesive layer AD2 may be filled in some or all of the plurality of openings 111. If the second adhesive layer AD2 is filled in the plurality of openings 111 of the back cover 110, a contact area between the second adhesive layer AD2 and the back cover 110 is increased so that a separation phenomenon or separation of the layers or components shown in FIG. 3 may be avoided.

In the meantime, the present disclosure relates to a flexible display device based on a polyimide substrate 121 in which the conductive layer 128 is formed below the substrate 121 to offset positive charges in the polyimide substrate 121 to improve the edge burn-in. This will be described in more detail with reference to the drawings.

Figure 4:
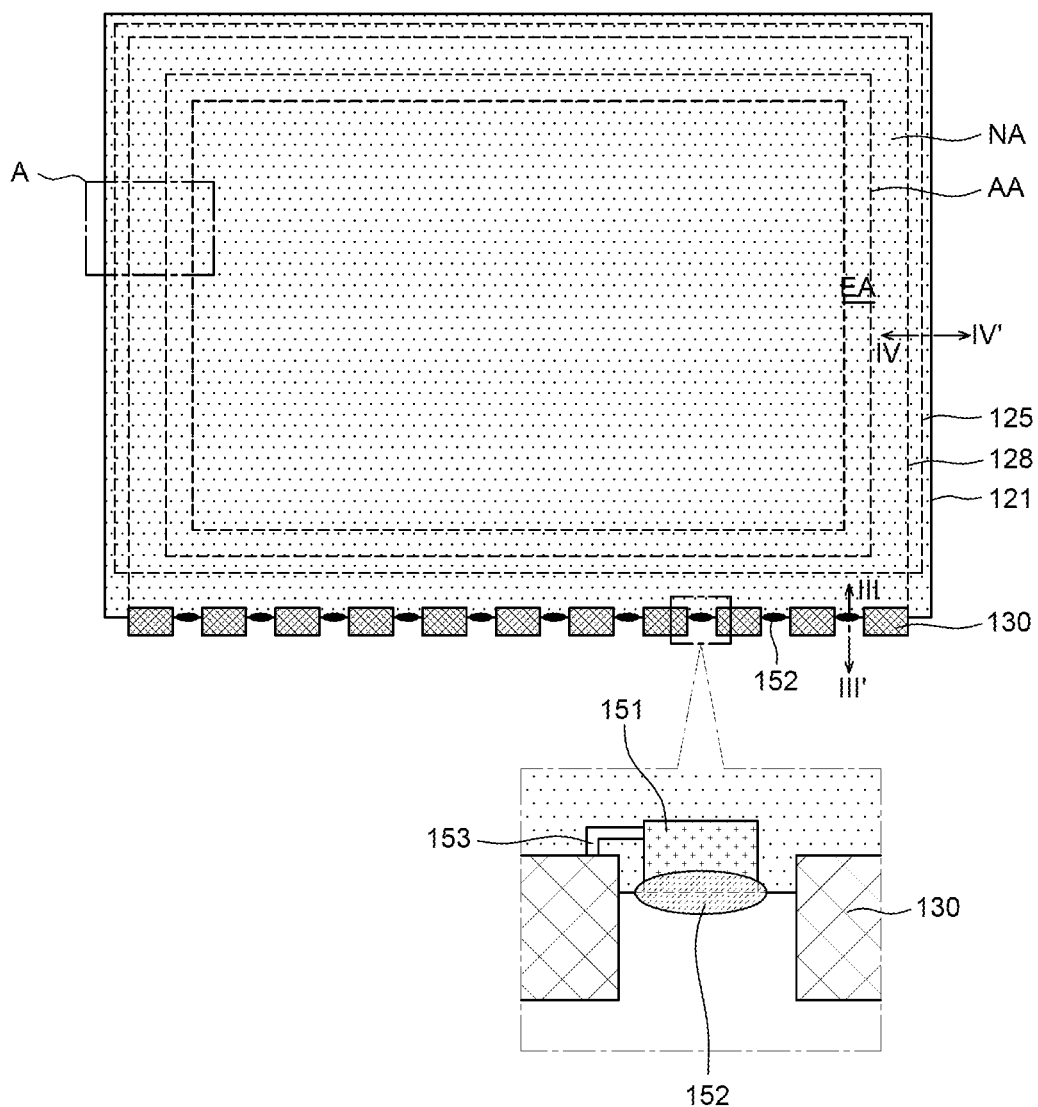
FIG. 4 is a plan view of a display panel of the display device of FIG. 1.

FIG. 4 is a plan view of the display panel 120 according to the first embodiment of the present disclosure.

Figure 5A:
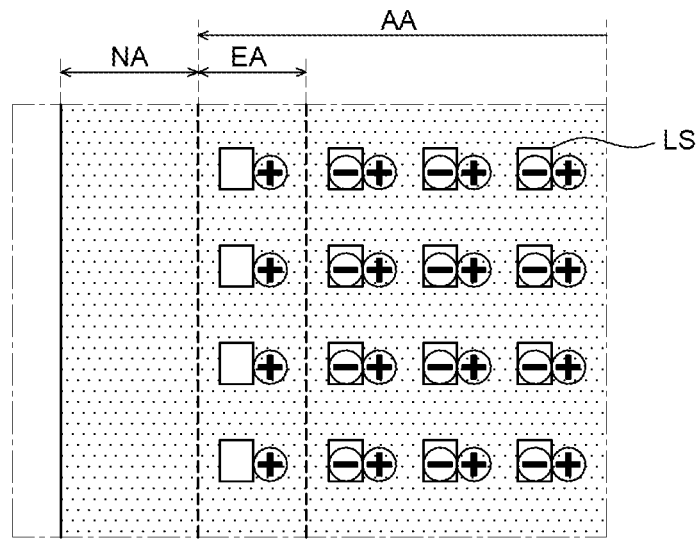
FIGS. 5A and 5B are enlarged views of a region A of the display panel of FIG. 4.
Figure 5B:
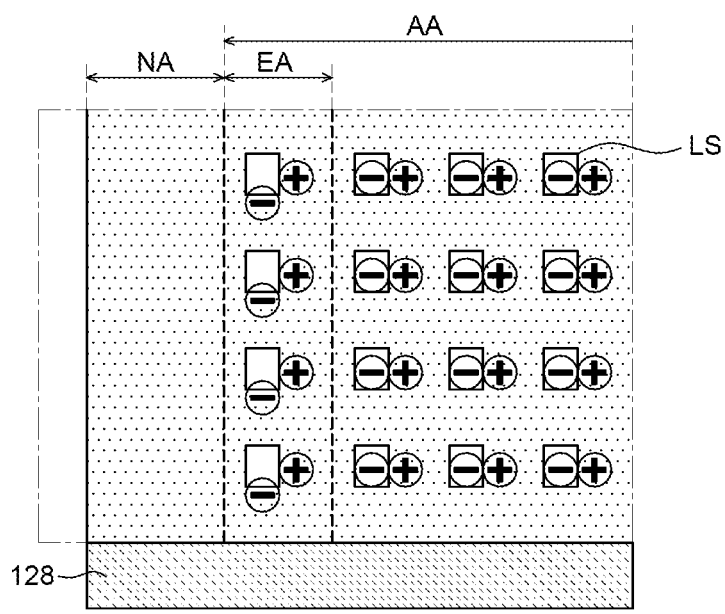

FIGS. 5A and 5B are enlarged views of a region A of the display panel 120 of FIG. 4.

Figure 6A:
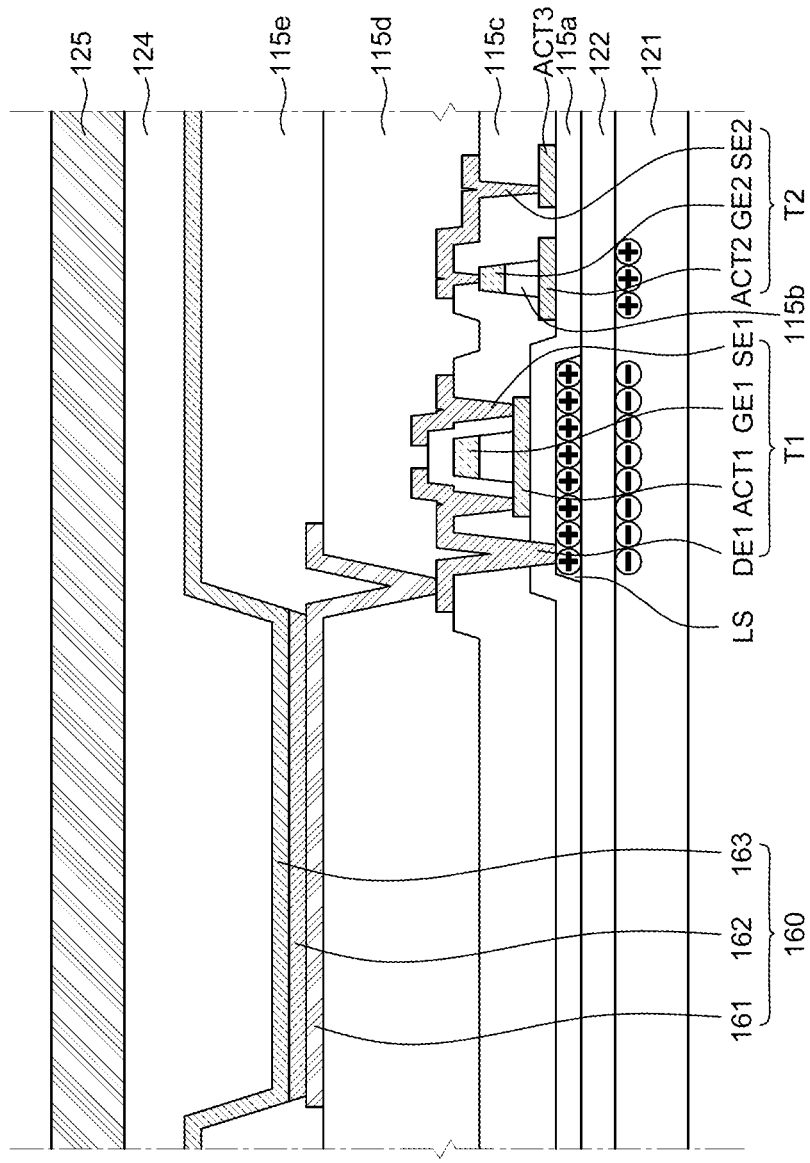
FIGS. 6A and 6B are cross-sectional views of a sub pixel of the display device of FIG. 1.
Figure 6B:
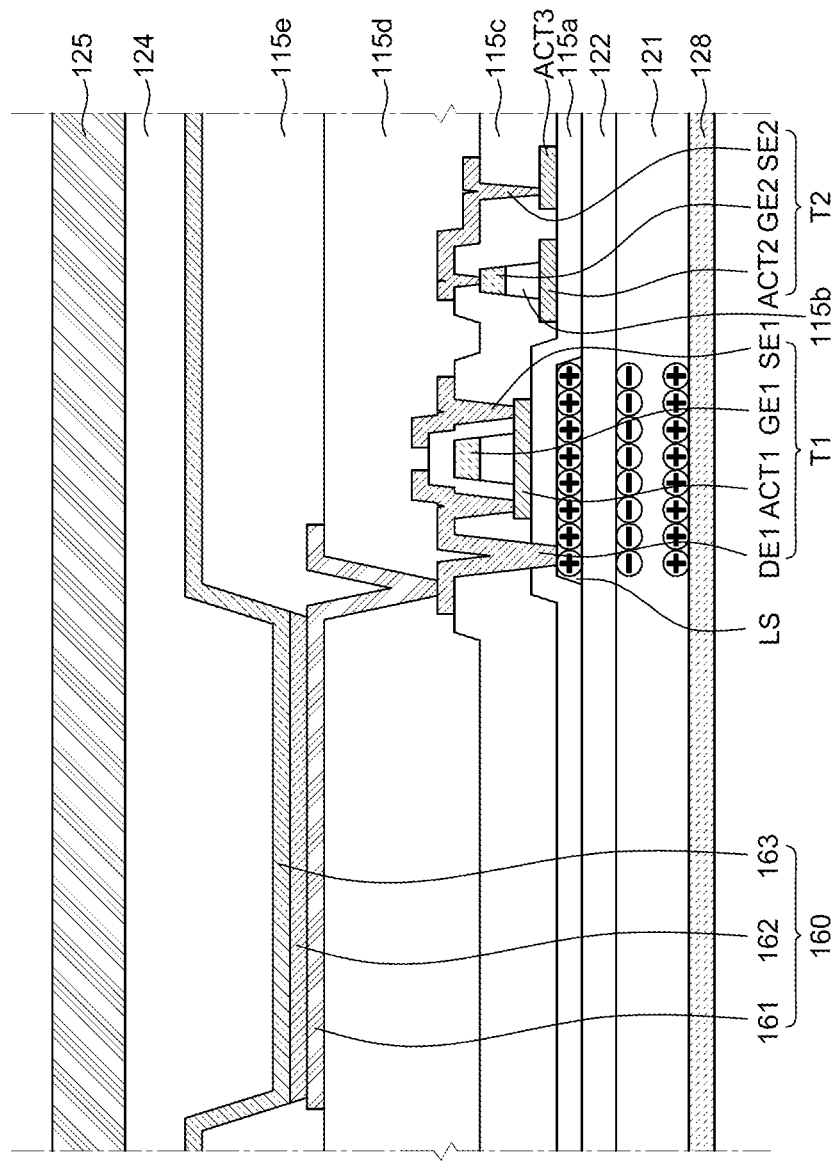

FIGS. 6A and 6B are cross-sectional views of a sub pixel of the display panel 120 according to the first embodiment of the present disclosure.

Figure 7:
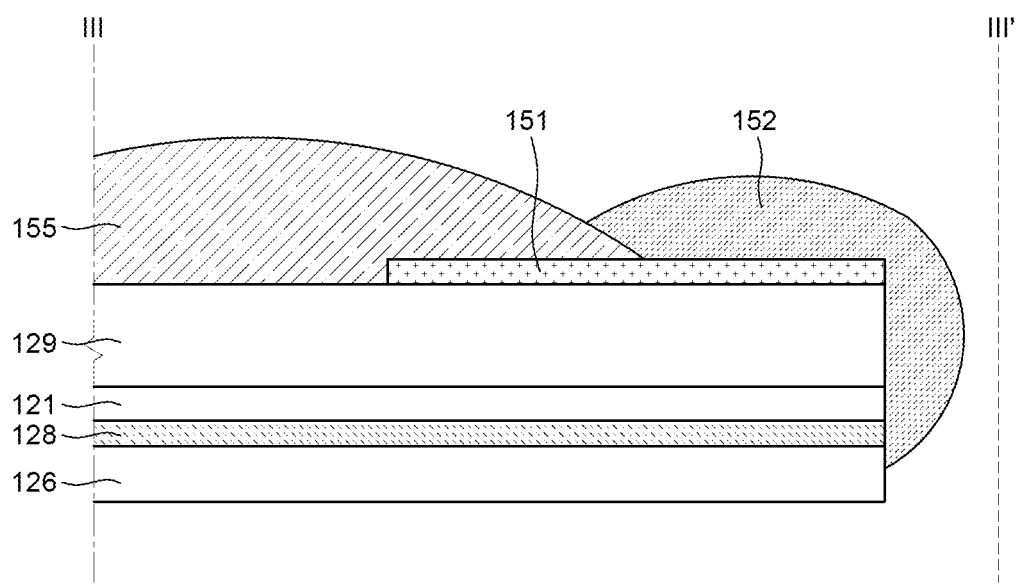
FIG. 7 is a cross-sectional view of the display panel of FIG. 4 taken along the line of FIG. 4.

FIG. 7 is a cross-sectional view of the display panel 120 taken along the line of FIG. 4.

Figure 8:
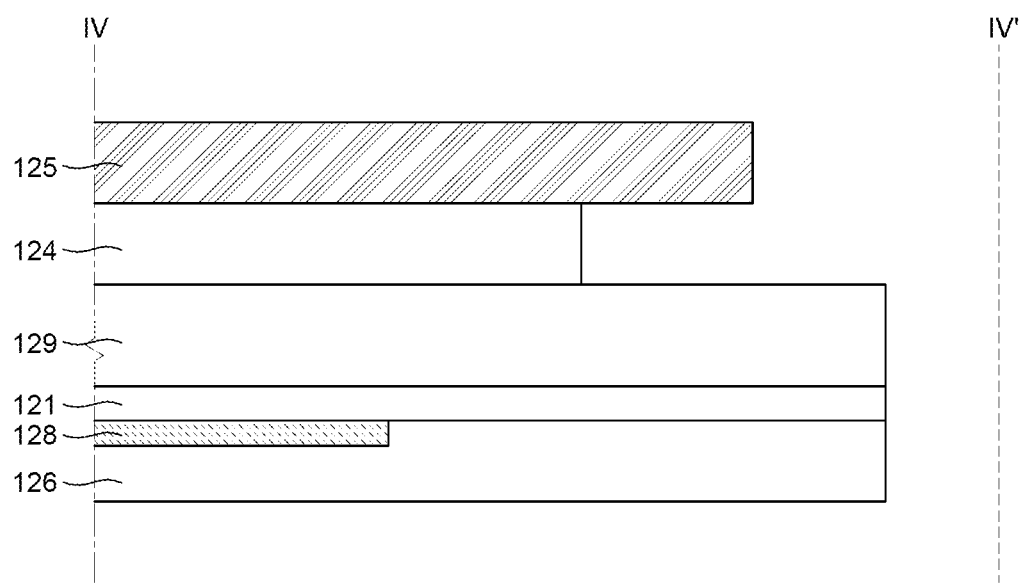
FIG. 8 is a cross-sectional view of the display panel of FIG. 4 taken along the line IV-IV' of FIG. 4.

FIG. 8 is a cross-sectional view of the display panel 120 taken along the line IV-IV' of FIG. 4.

FIG. 5A illustrates a part of a display panel according to Comparative Embodiment which does not include a conductive layer 128 of the present disclosure as an example and FIG. 5B illustrates a part of a display panel 120 of a first embodiment which includes a conductive layer 128 of the present disclosure as an example.

FIG. 6A illustrates a part of a cross-section of a sub pixel according to Comparative Embodiment which does not include a conductive layer 128 of the present disclosure as an example. FIG. 6B illustrates a part of a cross-section of a sub pixel of a first embodiment which includes a conductive layer 128 of the present disclosure as an example.

In FIGS. 6A, 6B, 7, and 8, for the convenience of description, the barrier film 126 and/or the polarizing plate 127 are not illustrated.

Even though in FIGS. 6A and 6B, one first transistor T1, one second transistor T2, and one third transistor are illustrated, it is not limited thereto. Further, in FIGS. 6A and 6B, for the convenience of description, only a part of the second transistor T2 and the third transistor is illustrated.

In FIGS. 7 and 8, for the purpose of convenience, the pixel unit 123 and various insulating layers are collectively referred to as a pixel layer 129.

Referring to FIG. 4, the display panel 120 according to the first embodiment of the present disclosure includes a display area AA and a non-display area NA.

The display area AA is an area where images are displayed in the display panel 120.

In the display area AA, a plurality of sub pixels which configures the plurality of pixels and a circuit for driving the plurality of sub pixels may be disposed. The plurality of sub pixels are minimum units which configure the display area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element, a wiring line, and the like. For example, the circuit may be configured by a thin film transistor, a storage capacitor, a gate line, a data line, and the like, but is not limited thereto.

A part of an edge of the display area AA may be defined as an edge area EA.

The edge area EA may have a width of 1 cm or more or less inwardly from the outermost edge of the display area AA adjacent to the non-display area NA, but is not limited thereto. The width may vary depending on the pixel design and the width of 1 cm may correspond to widths of approximately twelve sub pixels.

The edge area EA corresponds to an edge of the display area AA.

The non-display area NA is an area where no image is displayed.

In the non-display area NA, various wiring lines, circuits, and the like for driving the organic light emitting diode of the display area AA are disposed. For example, in the non-display area NA, a link line which transmits signals to the plurality of sub pixels and circuits of the display area AA or a driving IC such as a gate driver IC, a data driver IC, or the like may be disposed, but it is not limited thereto.

The non-display area NA may include a gate in panel (GIP) area in which a gate driver is disposed.

The non-display area NA may be adjacent to one or more side surfaces of the display area AA.

In FIG. 4, it is illustrated that the non-display area NA encloses a rectangular display area AA as an example. However, a shape of the display area AA and a shape and a placement of the non-display area NA adjacent to the display area AA are not limited to the example illustrated in FIG. 4. The display area AA and the non-display area NA may have shapes suitable for a design of an electronic device including the display device 100. Accordingly, the shape of the display area AA may be a pentagon, a hexagon, a circle, an oval, or the like.

Each pixel in the display area AA may include a pixel driving circuit. The pixel driving circuit may include one or more switching transistors and one or more driving transistors. Further, the pixel driving circuit may further include one or more sensing transistors. Each pixel driving circuit may be electrically connected to a gate line and a data line in order to communicate with a gate driver, a data driver, and the like located in the non-display area NA.

The gate driver and the data driver may be implemented by thin film transistors TFT in the non-display area NA. This driver is referred to as a GIP or a gate in panel driving circuit. Further, some components such as a data driver IC are mounted on a separated printed circuit board and are coupled to a connecting interface (a pad, a bump, a pin, etc.) disposed in the non-display area NA by a circuit film such as a flexible printed circuit board (FPCB), a chip-on-film (COF), or a tape-carrier-package (TCP).

The display device 100 may further include various additional elements to generate various signals or drive the pixel in the display area AA. The additional elements for driving the pixels may include an inverter circuit, a multiplexer, an electrostatic discharge circuit, or the like. The display device 100 may further include an additional element associated with a function other than a pixel driving function. For example, the display device 100 may include additional elements which provide a touch sensing function, a user authentication function (for example, fingerprint recognition), a multilevel pressure sensing function, a tactile feedback function, or the like. The above-mentioned additional elements may be located in an external circuit which is connected to the non-display area NA and/or the connecting interface.

The display device 100 according to the first embodiment of the present disclosure applies a voltage to or through the conductive layer 128 equal to a voltage which is applied to the gate electrode of the transistor of the display area AA by forming the conductive layer 128 below the substrate 121 of the display panel 120. This configuration improves edge burn-in.

That is, the conductive layer 128 according to the first embodiment of the present disclosure is formed below the substrate 121 to apply a voltage equal to a voltage applied to the gate electrode of the transistor of the display area AA. Therefore, the positive charges in the substrate 121 are offset to improve the edge burn-in.

For example, the conductive layer 128 according to the first embodiment of the present disclosure may be formed inwardly from the edge of the substrate 121 by a predetermined distance, on three surfaces except for a lower side of the display panel 120 on which the flexible film 130 is disposed, but is not limited thereto.

The conductive layer 128 may be applied with a low potential power voltage from the flexible film 130 of the COF by power line 153. The low potential power voltage may be substantially equal to a gate low voltage. To this end, the conductive electrode 151 is disposed on an upper surface of the display panel 120 and is electrically connected to the power line 153. Further, the conductive electrode 151 may be electrically connected to the conductive layer 128 below the substrate 121 by a connection member 152 disposed on a side surface of the display panel 120. That is, the connection member 152 extends from the side surface of the display panel 120 to an upper edge of the display panel 120 to electrically connect the side surface of the conductive layer 128 and the upper surface of the conductive electrode 151.

The conductive electrode 151 and the connection member 152 may be disposed between the flexible films 130.

The conductive electrode 151 may include any one of a group consisting of metal materials such as gold (Au), silver (Ag), aluminum (Al), molybdenum (Mo), palladium (Pd), magnesium (Mg), copper (CU), and an alloy thereof, but is not limited thereto.

The conductive electrode 151 may have various shapes including but not limited to a rectangular shape.

When the conductive electrode 151 has a rectangular shape, for example, a size may be approximately 10 mm×1.5 mm, but is not limited thereto.

The connection member 152 may be formed by dotting of silver (Ag), but is not limited thereto. Resistances of individual connection members 152 may be 10 kΩ or lower.

The connection member 152 may be formed to cover the entire width of the conductive electrode 151 in some embodiments.

In one or more embodiments, the connection member 152 may be formed between the flexible films 130 to have a width of 14.5 mm to 20 mm.

Specifically, in the display device 100 which applies polyimide as a substrate 121, an edge burn-in of the display panel 120 may be an issue. For example, the rollable display device 100 uses the polyimide as the substrate 121 enable rolling and unrolling of the display device 100.

The polyimide includes solvent and solids and mobile charges are generated due to a chemical bond after curing the polyimide. Referring to FIG. 5A, when an electric field is applied (driven) to the display panel 120, the mobile charges of the polyimide move. In the display device 100, an electric field difference is structurally caused depending on the presence of a light shielding layer LS between the display area AA and the non-display area NA. That is, referring to FIG. 6A, when the display panel 120 is driven, a positive (+) electric field may be formed on the light shielding layer LS below the first transistor T1 and a polarized mobile charge is formed on a surface of the polyimide substrate 121 due to the electric field. Negative (−) charges are gathered on the surface of the substrate 121 below the light shielding layer LS. In the other area, that is, below the second transistor T2 and/or the third transistor, relatively, positive (+) charges are gathered. In contrast, the light shielding layer LS is not provided or may extend only partially or to a portion of the GIP area of the non-display area NA such that positive (+) and negative (−) signals are alternately applied.

At the time of initial and long-term driving, negative (−) charges move below the light shielding layer LS and form a strong electric field that traps positive (+) charges in the other area. As compared with the edge area EA, the entire display panel 120 forms an electrical equilibrium state by the strong electric field of the other display area AA so that the edge burn-in does not occur in the other display area AA. For reference, "the other display area AA" refers to a portion of the display area AA excluding the edge area EA.

However, in the case of re-driving after finishing a driving cycle, positive (+) charges trapped in the edge area EA meet negative (−) charges which are generated at the time of the re-driving such that the net charge is offset (neutral) and regenerated positive (+) charges move in the vicinity of the lower portion of the light shielding layer LS. As a result, negative shift of a threshold voltage (Vth) of the second transistor T2 produces burn-in in the edge area EA due to a luminance difference between the edge area EA and the other display area AA. That is, the distribution of mobile charges in and out of the display area AA varies due to the difference in electric fields generated during the driving of the display panel 120 so that the trapped positive (+) charges cause a negative shift of Vth of the second transistor T2. This results in edge burn-in being generated in the edge area EA in which the charge imbalance is the most significant.

Further, when the display panel is repeatedly left at a room temperature for 24 hours after high-temperature driving and then re-driven, the burn-in level is increased. The burn-in level is reduced during continuous driving for 10 hours, but when the display panel is re-driven after being left for 24 hours, the burn-in level may reappear. The edge defect may be generated not only during the initial driving, but also during the re-driving after being left for a long time.

Accordingly, according to the present disclosure, referring to FIGS. 5B and 6B, the conductive layer 128 is formed below the substrate 121 of the display panel 120 to apply the low potential power voltage to the conductive layer 128 and offset positive (+) charges trapped below the second transistor T2 and/or the third transistor.

For example, when −6 V is applied to the second gate electrode GE2 of the second transistor T2 and/or the third transistor, which is a switching or sensing transistor, and 8 V is applied to the light shielding layer LS, a low potential power voltage which is a constant DC voltage may be applied to the conductive layer 128 below the substrate 121. For example, −6 V which is equal to a voltage applied to the second gate electrode GE2 may be applied to the conductive layer 128, but is not limited thereto.

In the bottom emission type, the conductive layer 128 may be a transparent conductive material, such as indium tin oxide (ITO), indium zinc oxide (IZO), indium gallium zinc oxide (IGZO), zinc oxide (ZnO), and the like or a doped amorphous silicon, but is not limited thereto. In this case, the thickness of the conductive layer 128 may be formed to be thin in consideration of the transmittance and electro-optical property.

In contrast, in the case of the top emission type, the conductive layer 128 may be formed of an opaque conductive material.

The conductive layer 128 may be electrically connected to the connection member 152 by means of side contact.

In some embodiments, when the conductive layer 128 is formed on an entire lower portion of the substrate 121, interruption occurs between the conductive layer 128 and the encapsulation substrate 125 or between the conductive layer 128 and a mechanical tool to cause a leakage current in the conductive layer 128. Therefore, the conductive layer 128 of the first embodiment of the present disclosure, for example, may be formed inwardly from the edge of the substrate 121 by a predetermined distance on three surfaces except for a lower side of the display panel 120 which forms side-contact with the connection member 152. For example, the conductive layer 128 may be inwardly formed from the edge of the substrate 121 by approximately 3 millimeters (mm), or between 2.5 mm and 3.5 mm, but is not limited thereto. For example, the distance between the outermost edge of the substrate 121 and the conductive layer may be more or less than 3 mm, such as less than 1, 1, 2, 4, 5, 6 or more millimeters. It is to be appreciated that this range of distances includes all numbers between the stated integers. For example, the above range includes a distance of 2.47 mm as well as 4.105 mm.

The encapsulation substrate 125 and the encapsulation layer 124 may be formed inwardly by 0.1 mm to 1.1 mm or more or less from the edge of the substrate 121 so that the conductive layer 128 may be formed further inward from the edge of the substrate 121 than the encapsulation substrate 125 and the encapsulation layer 124 (see FIG. 4).

Referring to FIGS. 6B, 7, and 8, the display panel 120 according to the first embodiment of the present disclosure may include the substrate 121 on which the thin film transistors T1 and T2 and the organic light emitting diode 160 are disposed, along with the encapsulation substrate 125, the barrier film 126, and the like.

The substrate 121 may be a glass or plastic substrate. When the substrate is a plastic substrate, polyimide-based or polycarbonate-based materials are used so that the substrate may have flexibility. Specifically, polyimide may be applied to a high temperature process and may be coated so that polyimide may be frequently used for the plastic substrate.

The buffer layer 122 is a functional layer which protects the transistors from impurities such as alkali ions, moisture and/or oxygen leaked from the substrate 121 or lower layers thereof. The buffer layer 122 may be configured by a single layer of silicon oxide (SiOx), silicon nitride (SiNx), or a multi-layer thereof, but is not limited thereto. The buffer layer 122 may include a multi buffer layer and/or an active buffer layer. The multi-buffer layer may be configured by alternately laminating silicon oxide (SiOx) and silicon nitride (SiNx) and perform a function of delaying the diffusion of moisture and/or oxygen permeating into the substrate 121. The active buffer layer performs a function of protecting active layers ACT1, ACT2, and ACT3 of the transistors T1 and T2 and blocking various types of defects entering from the substrate 121.

The pixel unit 123 includes an organic light emitting diode 160 and a pixel driving circuit for driving the organic light emitting diode 160. The pixel unit 123 may be an area corresponding to the display area AA.

The organic light emitting diode 160 includes an anode 161, an organic layer 162, and a cathode 163.

At least one first transistor T1, second transistor T2, and third transistor may be disposed on the buffer layer 122. The first transistor T1 may be a driving transistor, the second transistor T2 may be a sensing transistor, and the third transistor may be a switching transistor, but are not limited thereto.

The first transistor T1 includes a first active layer ACT1, a first gate electrode GE1, a first source electrode SE1, and a first drain electrode DE1.

The second transistor T2 includes a second active layer ACT2, a second gate electrode GE2, a second source electrode SE2, and a second drain electrode.

The third transistor may include a third active layer ACT3, a third gate electrode, a third source electrode, and a third drain electrode.

The light shielding layer LS may be disposed on the buffer layer 122.

The light shielding layer LS is disposed to overlap the first active layer ACT1 of the first transistor T1 to protect the first transistor T1 from light introduced from the outside or moisture introduced from the outside to minimize the deformation of the device characteristic of the first transistor T1. Even though in FIG. 6B, it is illustrated that the light shielding layer LS is electrically connected to the first drain electrode DE1, the light shielding layer LS may be floated, so that it is not limited thereto.

A first insulating layer 115a may be disposed on the light shielding layer LS.

The first insulating layer 115a may be configured as a single layer of silicon nitride SiNx or silicon oxide SiOx or a multi-layer thereof.

The first active layer ACT1, the second active layer ACT2, and the third active layer ACT3 may be disposed on the first insulating layer 115a. The first active layer ACT1, the second active layer ACT2, and the third active layer ACT3 may be formed of an oxide semiconductor material.

However, it is not limited thereto so that the first active layer ACT1, the second active layer ACT2, and the third active layer ACT3 may be formed of an amorphous silicon a-Si or various organic semiconductor materials such as pentacene.

The gate insulating layer 115b is disposed on the first active layer ACT1 and the second active layer ACT2 and the first gate electrode GE1 and the second gate electrode GE2 may be disposed thereon.

The gate insulating layer 115b may be a single layer of silicon nitride SiNx or silicon oxide SiOx or a multi-layer thereof.

The first gate electrode GE1 and the second gate electrode GE2 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

A second insulating layer 115c may be disposed on the first gate electrode GE1 and the second gate electrode GE2.

The second insulating layer 115c is an interlayer insulating layer and may be formed of an insulating inorganic material such as silicon oxide SiOx or silicon nitride SiNx or an insulating organic material. The second insulating layer 115c and/or the first insulating layer 115a is selectively removed to form a contact hole through which the light shielding layer LS, the second gate electrode GE2, and source and drain regions of the first active layer ACT1 are exposed.

The first source electrode SE1 and the first drain electrode DE1 may be disposed on the second insulating layer 115c. The first source electrode SE1 and the first drain electrode DE1 are disposed to be spaced apart from each other and may be electrically connected to the first active layer ACT1. Further, the first drain electrode DE1 may also be electrically connected to the light shielding layer LS.

The second source electrode SE2 may be disposed on the second insulating layer 115c. The second source electrode SE2 may be electrically connected to the second gate electrode GE2 and the third active layer ACTS.

A third insulating layer 115d may be disposed on the first source electrode SE1, the first drain electrode DE1, and the second source electrode SE2.

The third insulating layer 115d is a planarization layer to protect the transistors T1 and T2 and planarize an upper portion thoseof. The third insulating layer 115d may be configured by various forms so that the third insulating layer may be formed with an organic insulating layer such as benzocyclobutene (BCB) or acryl or an inorganic insulating layer such as silicon oxide (SiOx) or silicon nitride (SiNx) or formed as a single layer or a double or multiple layers.

The organic light emitting diode 160 may be disposed on the third insulating layer 115d.

The organic light emitting diode 160 includes an anode 161, an organic layer 162 formed on the anode 161, and a cathode 163 formed on the organic layer 162.

The organic light emitting diode 160 may be configured with a single light emitting layer structure which emits single light or may be configured with a structure which is configured by a plurality of light emitting layers to emit white light. When the organic light emitting diode 160 emits white light, a color filter may be further provided. The organic light emitting diode 160 may be disposed in the middle of the substrate 121 corresponding to the display area AA.

The anode 161 may be disposed on the third insulating layer 115d. The anode 161 may be electrically connected to the first drain electrode DE1 of the first transistor T1 by means of the contact hole.

The anode 161 supplies holes to the light emitting layer so that the anode may be formed of a conductive material having a high work function. For example, the anode 161 may be formed of a transparent conductive material such as indium tin oxide (ITO), indium zinc oxide (IZO), and the like, but is not limited thereto.

As described above, the display device 100 may be implemented by a top emission type or a bottom emission type. When the display device is a top emission type, a reflective layer, which is formed of a metal material having an excellent reflection efficiency such as aluminum (Al) or silver (Ag), may be added below the anode 161. Therefore, light emitted from the light emitting layer is reflected from the anode 161 to be directed to the upper direction toward the cathode 163. In contrast, when the display device 100 is a bottom emission type, the anode 161 may be only formed of a transparent conductive material.

The organic layer 162 may be disposed between the anode 161 and the cathode 163.

The organic layer 162 is an area where light is emitted by the coupling of the electrons and holes supplied from the anode 161 and the cathode 163.

In some embodiments, various organic light emitting diode structures for improving the efficiency and the lifespan of the organic light emitting diode and reducing power consumption are proposed to improve a quality and a productivity of the organic light emitting display device.

Accordingly, an organic light emitting diode with a tandem structure which uses a plurality of stacks, that is, a lamination of a plurality of electroluminescent units is proposed to implement the improved efficiency and lifespan characteristic, as well as an organic light emitting diode which applies one stack, that is, one electroluminescent unit (EL unit). However, the present disclosure is not limited to a tandem structure. Hereinafter, for the convenience of description, a tandem structure will be described as an example.

In the organic light emitting diode with a tandem structure, that is, a double stack structure using a lamination of a first electroluminescent unit and a second electroluminescent unit, an emission area where light is emitted by recombination of the electrons and the holes is disposed in each of the first electroluminescent unit and the second electroluminescent unit. Therefore, the light emitted from a first light emitting layer of the first electroluminescent unit and a second light emitting layer of the second electroluminescent unit causes constructive interference to provide high luminance as compared with the organic light emitting diode with a single stack structure.

The stack structure may include, for example, a charge generating layer disposed between the anode 161 and the cathode 163, a first stack disposed between the charge generating layer and the anode 161, and a second stack disposed between the cathode 163 and the charge generating layer. The charge generating layer is disposed between the first stack and the second stack to generate charges. The charge generating layer may be formed with a structure in which a p-type charge generating layer and an n-type charge generating layer are laminated. That is, the charge generating layer may be configured by a p-type charge generating layer and an n-type charge generating layer which generate positive charges and negative charges to both directions and substantially serve as an electrode.

Each of the first stack and the second stack may include at least one light emitting layer and include a common layer in an upper portion and a lower portion thereof with each light emitting layer therebetween.

A bank 115e may be disposed above the anode 161 and the third insulating layer 115d.

The bank 115e is an insulating layer disposed between the plurality of sub pixels to divide the plurality of sub pixels.

The bank 115e may include an opening which exposes a part of the anode 161. The bank 115e may be an organic insulating material disposed to cover an edge or a border of the anode 161. For example, the bank 115e may be formed of polyimide resin, acrylic resin, or benzocyclobutene (BCB) resin, but is not limited thereto.

The organic layer 162 may be disposed on the anode 161. The organic layer 162 may include a light emitting layer disposed in each of the plurality of sub pixels and a common layer which is commonly disposed in the plurality of sub pixels. The light emitting layer is an organic layer which emits light having a specific color and different light emitting layers are disposed in a first sub pixel, a second sub pixel, and a third sub pixel, respectively. However, the present disclosure is not limited thereto so that a plurality of light emitting layers is provided in all sub pixels to emit white light.

The common layer is an organic layer which is disposed to improve luminous efficiency of the light emitting layer. The common layer may be formed as one layer over the plurality of sub pixels. That is, the common layers of the plurality of sub pixels are connected to each other to be integrally formed. The common layer may include a hole injection layer, a hole transport layer, an electron transport layer, an electron injection layer, a charge generating layer, and the like, but is not limited thereto.

The cathode 163 is disposed on the organic layer 162.

The cathode 163 is an electrode which supplies electrons to the organic light emitting diode 160.

The cathode 163 is formed of a material having a low work function. The cathode 163 may include a transparent conductive material. For example, the cathode 163 may be formed of indium tin oxide (ITO), indium zin oxide (IZO), indium gallium zinc oxide (IGZO), or the like. Alternatively, the cathode 163 may include any one of a group consisting of metal materials such as gold (Au), silver (Ag), aluminum (Al), molybdenum (Mo), magnesium (Mg), palladium (Pd), copper (CU), and an alloy thereof. For example, the cathode 163 may be formed of an alloy of magnesium (Mg) and silver (Ag). Alternatively, the cathode 163 may be configured by laminating a layer formed of a transparent conductive material such as ITO, IZO, or IGZO and a layer formed of a metal material such as gold (Au), silver (Ag), aluminum (Al), molybdenum (Mo), magnesium (Mg), palladium (Pd), copper (CU), or an alloy thereof, but is not limited thereto.

The cathode 163 is electrically connected to a low potential power line to be supplied with a low potential power voltage.

The encapsulation layer 124 may be disposed on the cathode 163. The encapsulation layer 124 may be disposed above the bank 115e and the organic light emitting diode 160. The encapsulation layer 124 may block the oxygen and moisture which permeate into the display device 100 from the outside. For example, when display device 100 is exposed to the moisture or oxygen, a pixel shrink phenomenon that the emission area is shrunk occurs or a dead pixel in the emission area is generated. The encapsulation layer 124 blocks the oxygen and the moisture to protect the display device 100.

The encapsulation layer 124 may include a first encapsulation layer, a second encapsulation layer, and a third encapsulation layer.

The first encapsulation layer is disposed on the cathode 163 and may suppress the permeation of moisture or oxygen. The first encapsulation layer may be formed of an inorganic material such as silicon nitride (SiNx), silicon oxy nitride (SiNxOy), or aluminum oxide (AlyOz), but is not limited thereto.

The second encapsulation layer is disposed on the first encapsulation layer to planarize a surface. Further, the second encapsulation layer may cover foreign materials or particles which may be generated during a manufacturing process of the display device. The second encapsulation layer may be formed of an organic material, such as silicon oxy carbon (SiOxCz), acryl or epoxy resin, but is not limited thereto.

The third encapsulation layer is disposed on the second encapsulation layer and may suppress the permeation of the moisture or oxygen, like the first encapsulation layer. The third encapsulation layer may be formed of an inorganic material such as silicon nitride (SiNx), silicon oxy nitride (SiNxOy), silicon oxide (SiOx), or aluminum oxide (AlyOz), but is not limited thereto.

The encapsulation substrate 125 is disposed on the encapsulation layer 124.

The encapsulation substrate 125 protects the organic light emitting diode 160 together with the encapsulation layer 124. The encapsulation substrate 125 may protect the organic light emitting diode 160 of the pixel unit 123 from moisture, oxygen, and impacts of the outside. The encapsulation substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 125 is formed of a metal material, the encapsulation substrate 125 may be implemented by an ultra-thin film and have a high resistance against external impacts and scratches, but is not limited thereto.

In some embodiments, as described above, the conductive layer 128 may be disposed below the substrate 121 to suppress an edge burn-in in an edge area EA of the display panel 120.

The conductive layer 128 may be formed inwardly from the edge of the substrate 121 by a predetermined distance, on three surfaces of the display panel 120 except for a lower side of the display panel 120 on which the flexible film 130 is disposed, but is not limited thereto. Referring to FIG. 7, the conductive layer 128 is formed at a lower side of the display panel 120 on which the flexible film 130 is disposed to match the edge of the substrate 121. In other words, the conductive layer 128 extends to the edge of the substrate 121 at a lower side of the display panel 120 corresponding to the flexible film 130 in some embodiments. Further, referring to FIG. 8, on three surfaces (that is, an upper portion and both side portions of the display panel 120) of the display panel 120 except for the lower side, the conductive layer 128 is formed inwardly from the edge of the substrate 121 by a predetermined distance.

For example, the conductive layer 128 may be inwardly formed by 3 mm from the edge of the substrate 121, but is not limited thereto. The encapsulation substrate 125 and the encapsulation layer 124 may be formed inwardly by 0.1 mm to 1.1 mm from the edge of the substrate 121 so that the conductive layer 128 is further inward from the edge of the substrate 121, and more inward than the encapsulation substrate 125 and the encapsulation layer 124.

The conductive layer 128 may have various shapes including but not limited to a rectangle.

As described above, the conductive layer 128 may be applied with a low potential power voltage from the flexible film 130 of the COF by the power line 153. That is, the conductive electrode 151 electrically connected to the power line 153 is disposed on an upper surface of the display panel 120 and is electrically connected to the power line 153 by the connection member 152, which is disposed on a side surface of the display panel 120.

The connection member 152 extends from the side surface of the display panel 120 to an upper edge of the display panel 120 to electrically connect the side surface of the conductive layer 128 at the edge of the substrate 121 and the upper surface of the conductive electrode 151.

The connection member 152 may be formed by dotting of silver (Ag), but is not limited thereto.

The connection member 152 may be formed to cover the entire width of the conductive electrode 151. In some embodiments, the connection member 152 covers only a portion of the width of the conductive electrode 151.

In one or more embodiments, a sealing layer 155 may be formed above the conductive electrode 151 to suppress moisture permeation and minimize defects during subsequent processing. The sealing layer 155 may be a micro seal, but is not limited thereto.

The sealing layer 155 may be disposed so as to cover one end of the conductive electrode 151.

The sealing layer 155 may be disposed so as to enclose the display area AA in the non-display area NA. The sealing layer 155 may also be disposed so as to enclose the encapsulation layer 124 and the encapsulation substrate 125.

The connection member 152 may be formed on the sealing layer 155 and also formed to cover the other end of the conductive electrode 151 which is not covered by the sealing layer 155. Thus, the connection member 152 is exposed at one end of the sealing layer 155, as shown in FIG. 7.

The connection member 152 may have a height that is greater than, equal to, or less than a height of the barrier film 126.

The connection member 152 may be formed to be lower than, equal to, or higher than, the sealing layer 155.

In some embodiments, a glass substrate having a thin thickness may be added below the polyimide substrate as a support substrate to suppress moisture permeation, which will be described in more detail with reference to the following second embodiment of the present disclosure.

Figure 9:
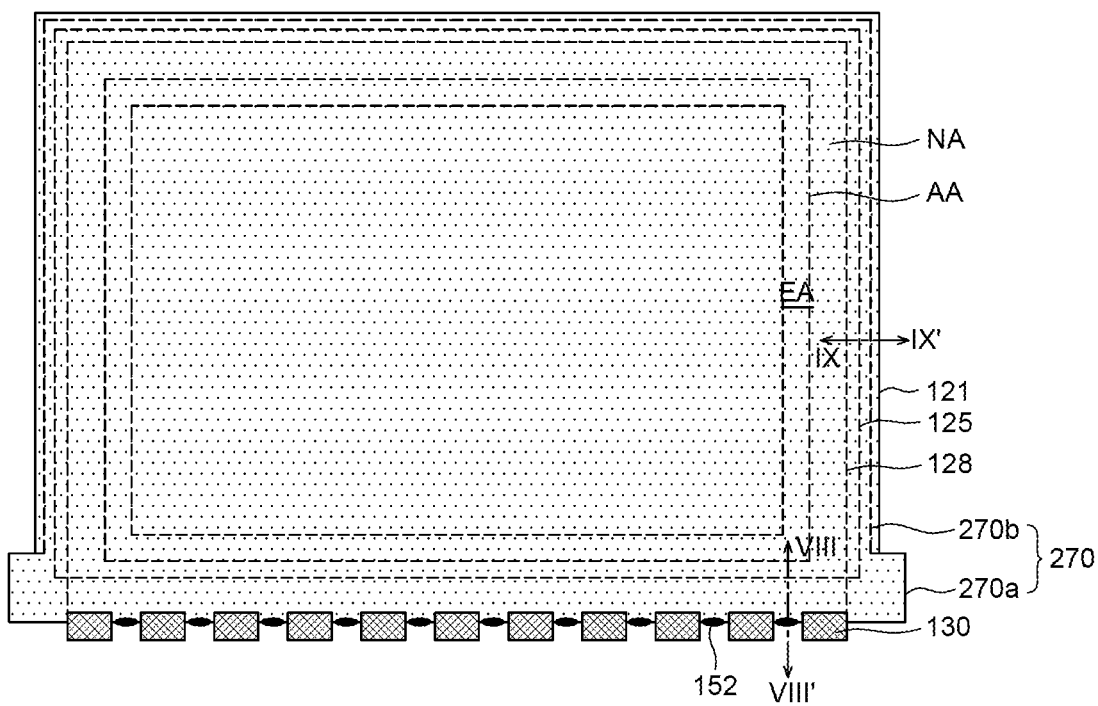
FIG. 9 is a plan view of a display panel according to a second embodiment of the present disclosure.

FIG. 9 is a plan view of a display panel 220 according to a second embodiment of the present disclosure.

Figure 10A:
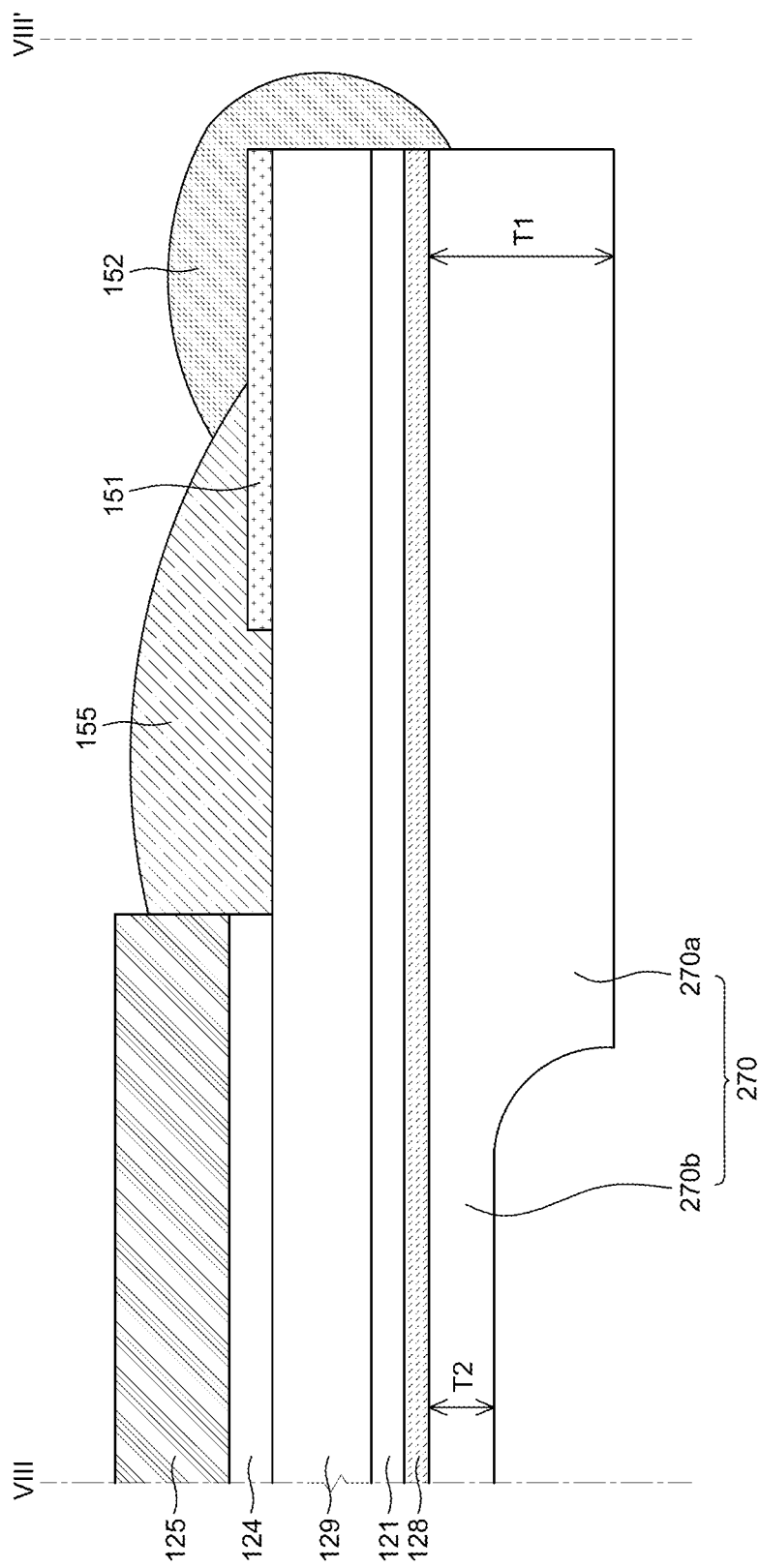
FIG. 10A is a cross-sectional view of the display panel of FIG. 9 taken along the line VIII-VIII' of FIG. 9.

FIG. 10A is a cross-sectional view of the display panel 220 taken along the line VIII-VIII' of FIG. 9.

Figure 10B:
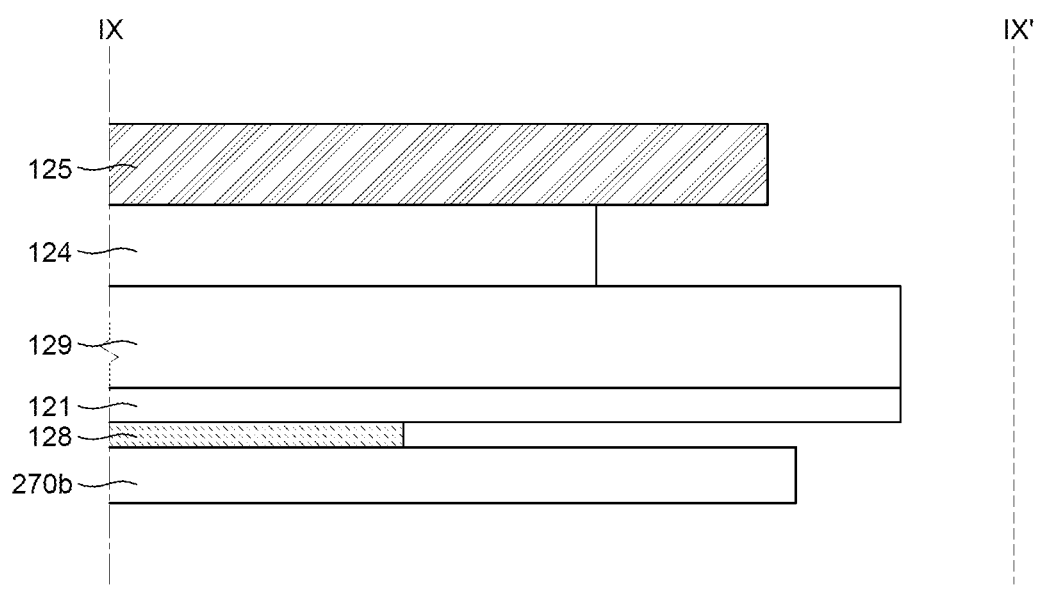
FIG. 10B is a cross-sectional view of the display panel of FIG. 9 taken along the line IX-IX' of FIG. 9.

FIG. 10B is a cross-sectional view of the display panel 220 taken along the line IX-IX' of FIG. 9.

The display panel 220 may be substantially similar to, or substantially the same as, the display panel 120 of FIG. 4, except for a support substrate 270 of the display panel 220 according to the second embodiment of the present disclosure shown in FIG. 9. Thus, redundant description will be omitted.

In FIGS. 10A and 10B, for the purpose of convenience, the pixel unit 123 and various insulating layers are collectively referred to as a pixel layer 129 and a polarizing plate 127 is not illustrated.

Referring to FIGS. 9, 10A, and 10B, a display panel 220 according to the second embodiment of the present disclosure may include a display area AA and a non-display area NA.

A part of an edge of the display area AA may be defined as an edge area EA.

According to the second embodiment, similarly to the above-described first embodiment of the present disclosure, the conductive layer 128 is formed below the polyimide substrate 121 to apply a voltage equal to a voltage applied to the gate electrode of the transistor of the display area AA, for example, a low potential power voltage. By doing this, the edge burn-in is improved.

For example, the conductive layer 128 of the second embodiment of the present disclosure may be formed inwardly from the edge of the substrate 121 by a predetermined distance on three surfaces except for a lower side of the display panel 220 which is in side contact with the connection member 152.

The conductive layer 128 may be applied with a low potential power voltage from the flexible film 130 of the COF by the power line 153.

The conductive layer 128 may be electrically connected to the connection member 152 by side contact.

The connection member 152 extends from the side surface of the display panel 220 to an upper edge of the display panel 220 to electrically connect the side surface of the conductive layer 128 and the upper surface of the conductive electrode 151.

The connection member 152 may be formed by dotting of silver (Ag), but is not limited thereto.

The connection member 152 may be formed to cover the entire width of the conductive electrode 151.

In the meantime, a sealing layer 155 may be formed above the conductive electrode 151 to suppress moisture permeation and minimize defects during subsequent processing.

The sealing layer 155 may be disposed so as to cover one end of the conductive electrode 151.

The sealing layer 155 may be disposed so as to enclose the display area AA in the non-display area NA and may also be disposed so as to enclose the encapsulation layer 124 and the encapsulation substrate 125.

The connection member 152 may be formed on the sealing layer 155 and may also be formed to cover the other end of the conductive electrode 151 which is not covered by the sealing layer 155 such that the connection member 152 is exposed at one end of the sealing layer 155.

The connection member 152 may be formed to be lower than the sealing layer 155.

A support substrate 270 may be disposed below the conductive layer 128.

The support substrate 270 may be disposed to suppress moisture permeation and support the substrate 121.

The support substrate 270 may be formed of glass, but is not limited thereto.

When the support substrate 270 is glass, a thickness thereof is partially etched to be appropriate for the flexible display device. That is, after disposing a glass having a first thickness below the conductive layer 128, a predetermined thickness is etched to form a support substrate 270 having a second thickness.

For example, the first thickness T1 of the support substrate 270 at the edge of the support substrate 270 may be 0.7 T and the second thickness T2 of the support substrate 270 inward from the edge of the support substrate 270 may be 0.08 T, but is not limited thereto.

The support substrate 270 may have its original thickness in a lower side of the display panel 220 where the flexible film 130 is disposed, that is, in a pad unit. Accordingly, the support substrate 270 may be configured by a first support substrate 270a having the first thickness T1 and a second support substrate 270b with the second thickness T2.

The first support substrate 270a is not etched so that the width is an original width and the encapsulation substrate 125 is located inside the first support substrate 270a. In other words, the encapsulation substrate 125 extends to be disposed on at least a portion of the first support substrate 270a.

In contrast, the second support substrate 270b is also etched in a width direction so that the second support substrate 270b is located inwardly from an outer edge of the encapsulation substrate 125.

The first support substrate 270a is formed to match the edge of the substrate 121 and the second support substrate 270b may be formed inwardly from the edge of the substrate 121 by a predetermined distance such as any distance between 1 to 10 mm or more or less.

The conductive layer 128 above the first support substrate 270a matches the edge of the substrate 121 below the display panel 220 and may be formed inwardly from the edge of the substrate 121 on both side surfaces of the display panel 220.

Further, the conductive layer 128 above the second support substrate 270b may be formed inwardly from the edge of the substrate 121 by a predetermined distance, on three surfaces of the display panel 220 except for the lower side.

The connection member 152 may be formed up to a predetermined height of the support substrate 270.

In the meantime, the conductive layer of the present disclosure may be located only below the switching or sensing transistor, which will be described in detail with reference to the following third embodiment of the present disclosure.

Figure 11:
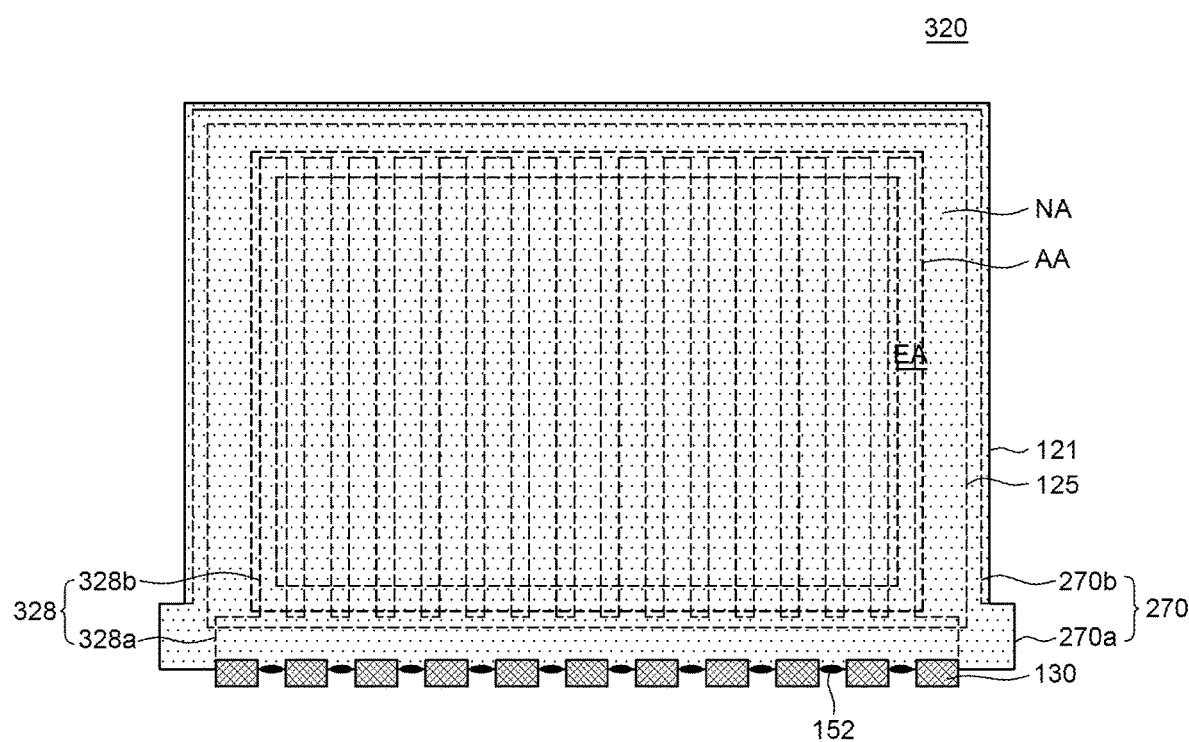
FIG. 11 is a plan view of a display panel according to a third embodiment of the present disclosure.

FIG. 11 is a plan view of a display panel 320 according to a third embodiment of the present disclosure.

The display panel 320 may be substantially similar or substantially the same as the display panel 220 of FIG. 9, except for a conductive layer 328 of the display panel 320 according to the third embodiment of the present disclosure shown in FIG. 11. Thus, redundant description will be omitted. The same configuration will be denoted with the same reference numerals.

Referring to FIG. 11, the display panel 320 according to the third embodiment of the present disclosure may include a display area AA and a non-display area NA.

A part of an edge of the display area AA may be defined as an edge area EA.

According to the third embodiment of the present disclosure, similarly to the above-described first and second embodiments of the present disclosure, the conductive layer 328 is formed below the polyimide substrate 121 to apply a voltage equal to a voltage applied to the gate electrode of the transistor of the display area AA, for example, a low potential power voltage. By doing this, the edge burn-in is improved.

The conductive layer 328 of the third embodiment of the present disclosure may include a first conductive layer 328a which is formed below the display panel 320 to form a side contact with the connection member 152 and a plurality of second conductive layers 328b which are divided from the first conductive layer 328a and extend vertically. However, it is not limited thereto.

The second conductive layers 328b may be disposed below the switching or sensing transistor T2 below the substrate 121. The second conductive layers 328b may be disposed to sufficiently block the switching or sensing transistor T2. For example, when the switching or sensing transistor T2 is disposed to be vertically parallel to the display panel 320, the second conductive layers 328b are also disposed to be vertically parallel.

The first conductive layer 328a may be applied with a low potential power voltage from the flexible film 130 by the power line 153.

The first conductive layer 328a may be electrically connected to the connection member 152 by side contact.

The connection member 152 extends from the side surface of the display panel 320 to an upper edge of the display panel 320 to electrically connect the side surface of the first conductive layer 328a and the upper surface of the conductive electrode 151.

The connection member 152 may be formed by dotting of silver (Ag), but is not limited thereto.

The connection member 152 may be formed to cover the entire width of the conductive electrode 151.

A support substrate 270 is disposed below the conductive layer 328.

The support substrate 270 may be formed of glass, but is not limited thereto.

When the glass is applied as the support substrate 270, a thickness thereof is partially etched to be appropriate for the flexible display device.

The support substrate 270 may have its original thickness in a lower side of the display panel 320 where the flexible film 130 is disposed, that is, in a pad unit. Accordingly, the support substrate 270 may be configured by a first support substrate 270a having a first thickness and a second support substrate 270b having a second thickness.

The first support substrate 270a is not etched so that the width is an original width and the encapsulation substrate 125 is located inside the first support substrate 270a.

In contrast, the second support substrate 270b is also etched in a width direction so that the second support substrate is located inwardly from the encapsulation substrate 125.

The first support substrate 270a is formed to match the edge of the substrate 121 and the second support substrate 270b may be formed inwardly from the edge of the substrate 121 by a predetermined distance.

The first conductive layer 328a above the first support substrate 270a matches the edge of the substrate 121 below the display panel 320 and may be formed inwardly from the edge of the substrate 121 on both side surfaces of the display panel 320.

Further, the second conductive layer 328b above the second support substrate 270b may be formed in the display area AA of the display panel 320, on three surfaces of the display panel 320 except for the lower side.

Figure 12A:
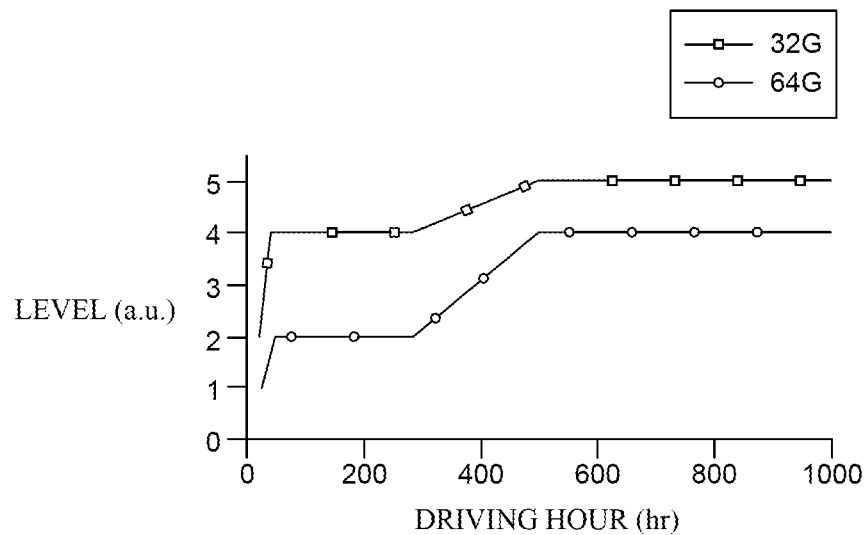
FIGS. 12A to 12C are graphs illustrating a level of an edge burn-in according to a driving time.
Figure 12B:
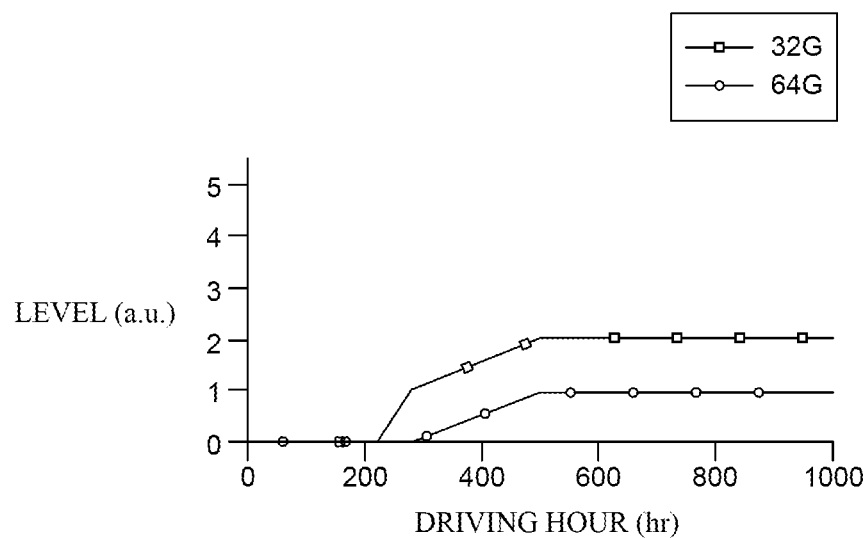
Figure 12C:
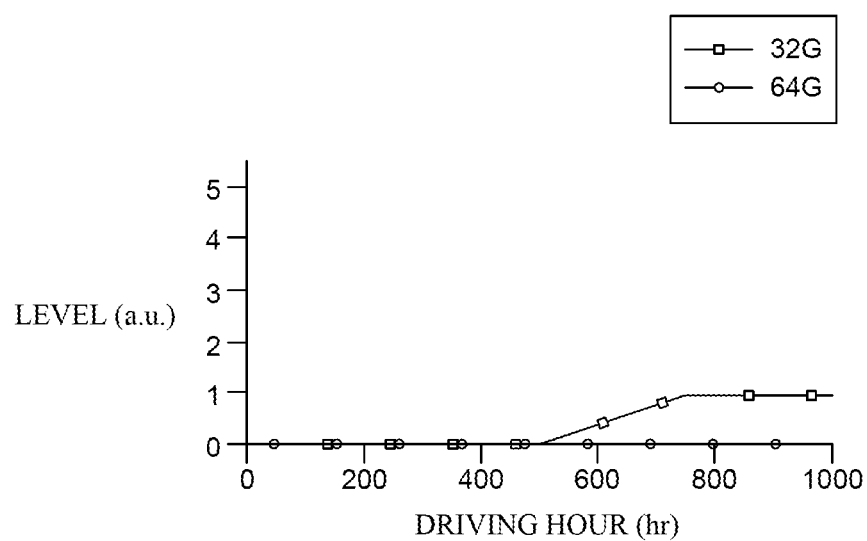

FIGS. 12A to 12C are graphs illustrating a level of an edge burn-in according to a driving time.

FIGS. 12A to 12C relatively illustrate an edge burn-in level with respect to the 1000 hour-driving at a high temperature.

FIG. 12A illustrates a result of a display device of a Comparative Embodiment, FIG. 12B illustrates a result of Experimental Example 1 in which the conductive layer is grounded, and FIG. 12C illustrates a result of Experimental Example 2 in which a low potential power voltage is applied to a conductive layer.

In FIGS. 12A to 12C, line 32G shows a measurement result at 32 gray levels as an example and line 64G shows a measurement result at 64 gray levels.

Referring to the measurement of the Comparative Embodiment in FIG. 12A, negative (−) charges in the edge area flow in the display area due to a strong electric field in a display area in which a density of the light shielding layer is high and remaining positive (+) charges are trapped due to the electric field stress. Accordingly, an edge burn-in level is relatively high and it is understood that as the driving time is increased, the level of the edge burn-in is increased to 4 to 5.

In contrast, referring to FIG. 12B, in Experimental Example 1, as the charges are small and the potential difference is reduced below the switching or sensing transistor, the electric field stress is lowered so that the trapped positive (+) charges are reduced. Accordingly, an edge burn-in level is relatively low and it is understood that as the driving time is increased, the level of the edge burn-in is maintained to 1 to 2.

Referring to FIG. 12C, in Experimental Example 2, there is almost no charge below the switching or sensing transistor and there is no potential difference. Thus, there is no electric field stress such that the positive (+) charges are hardly trapped. Accordingly, an edge burn-in level is relatively low and it is understood that as the driving time is increased, the level of the edge burn-in is maintained to 0 to 1.

Figure 13A:
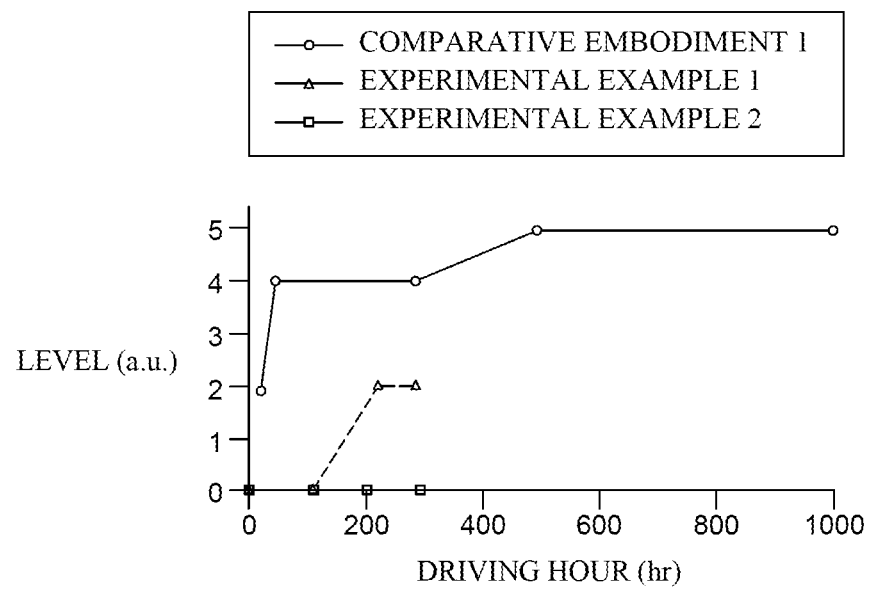
FIGS. 13A to 13C are graphs illustrating a level of an edge burn-in according to a driving time.
Figure 13B:
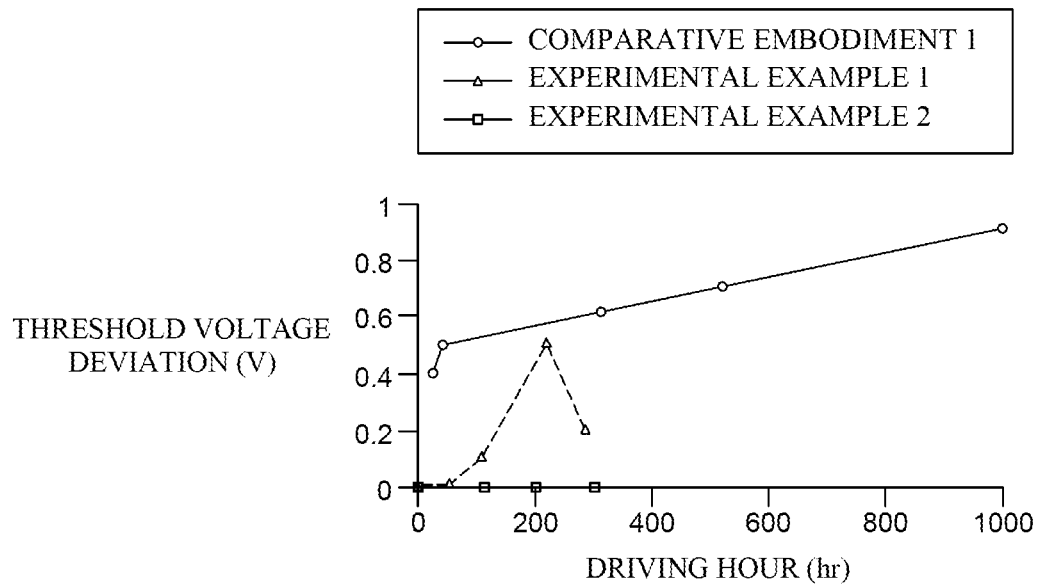
Figure 13C:
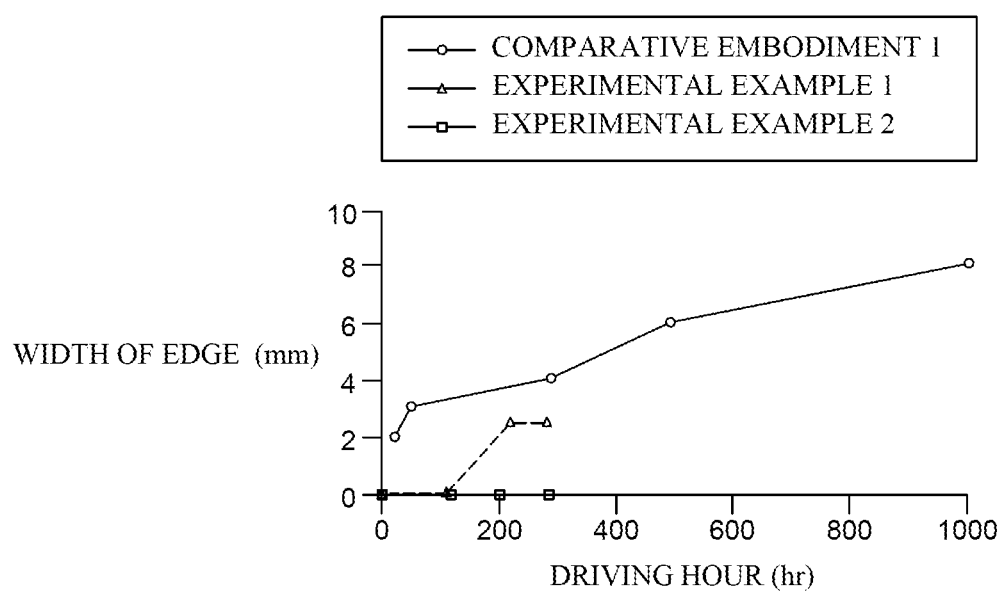

FIGS. 13A to 13C are graphs illustrating a result of measuring an edge burn-in according to a driving time.

FIG. 13A relatively shows a level of an edge burn-in according to a driving time and FIG. 13B shows a deviation of a threshold voltage Vth between an edge area and the other or remaining area of the active area according to a driving time. Further, FIG. 13C shows a width of an edge area in which an edge burn-in is shown according to a driving time.

FIGS. 13A to 13C show results of a Comparative Embodiment, Experimental Example 1 in which a conductive layer is grounded, and Experimental Example 2 in which a low potential power voltage is applied to a conductive layer.

FIGS. 13A to 13C show an example of a measurement result at 32 gray levels.

Referring to FIG. 13A, it is understood that as described above, as compared with Comparative Embodiment, in Experimental Example 1, the level of the edge burn-in is relatively low and the level of the edge burn-in is maintained to 0 to 1 as the driving time is increased. Further, it is understood that in Experimental Example 2, the level of the edge burn-in is maintained to 0, regardless of the driving time.

Referring to FIG. 13B, it is understood that in the Comparative Embodiment, a deviation of a threshold voltage Vth between the edge area and the other area is 0.4 to 1 V, but in Experimental Example 1, the deviation is lowered to 0 to 0.5 V. Further, it is understood that in Experimental Example 2, there is no deviation of a threshold voltage Vth between the edge area and the other area regardless of the driving time.

Referring to FIG. 13C, it is understood that in Comparative Embodiment, a width of the edge area where the edge burn-in appears is 2 to 8 mm, but in Experimental Example 1, the width of the edge area is reduced to 0 to 3 mm. Further, it is understood that in Experimental Example 2, there is no edge burn-in regardless of the driving time, so that a width of the edge area in which the edge burn-in appears is 0 mm.

FIG. 14 is a table illustrating an evaluation result during the initial driving.

Referring to FIG. 14, in the Comparative Embodiment, as the driving time is increased from 0 to 1 hour, the deviation ΔVth of the threshold voltage Vth is increased from 0.2 V to 0.5 V and the edge burn-in level is 1 during one-hour of driving time so that it is understood that edge burn defects are generated.

In contrast, in Experimental Example 1, it is understood that as the driving time is increased from 0 to 30 minutes, the deviation of the threshold voltage Vth is not changed at 0 V and during 30 minutes of driving time, there is no edge burn-in.

In Experimental Example 2, it is understood that as the driving time is increased from 0 to 30 minutes, the deviation of the threshold voltage Vth is not changed at 0 V and during 30 minutes of driving time, there is no edge burn-in.

The embodiments of the present disclosure can also be described as follows:

According to an aspect of the present disclosure, there is provided a display device. The display device includes a display panel which is divided into a display area and a non-display area and includes a substrate, a transistor which is disposed above the substrate and is provided in the display area, a flexible film which is disposed on a side surface of the non-display area and is connected to the substrate and a conductive layer which is disposed below the substrate and is applied with a low potential power voltage from the flexible film.

The display device may further include a barrier film disposed below the conductive layer.

The display device may further include a support substrate disposed below the conductive layer.

The conductive layer may be formed inwardly from an edge of the substrate on remaining side surfaces except for one side surface of the non-display area.

The display device may further include an encapsulation substrate disposed above the substrate, wherein the conductive layer may be formed inwardly from an edge of the encapsulation substrate.

The substrate may be configured by polyimide and the support substrate may be configured by glass.

The support substrate may include a first support substrate which is disposed to be opposite to one side surface of the non-display area and has a first thickness and a second support substrate which is disposed to be opposite to the other side surface and has a second thickness which is smaller than the first thickness.

The side surface of the first support substrate may match the edge of the substrate and the side surface of the encapsulation substrate may be located inwardly from the first support substrate.

A side surface of the second support substrate may be located inwardly from the encapsulation substrate.

A side surface of the conductive layer above the first support substrate may match the edge of the substrate on one side surface of the non-display area and the conductive layer may be formed inwardly from the edge of the substrate on both side surfaces which are in contact with the one side surface.

The conductive layer above the second support substrate may be formed inwardly from the edge of the substrate on the other side surfaces of the non-display area.

The conductive layer may be applied with a voltage which is equal to a voltage applied to a gate electrode of the transistor.

The display device may further include a power line which is disposed on an upper surface of the display panel and is connected to the flexible film to be applied with the low potential power voltage, a conductive electrode which is disposed on the upper surface of the display panel between the flexible films and is connected to the power line and a connection member which is disposed from a side surface of the display panel to the upper surface to cover an upper surface of the conductive electrode.

The connection member may be electrically connected to a side surface of the conductive layer and the upper surface of the conductive electrode.

The conductive layer may include a first conductive layer which is disposed on one side surface of the non-display area to be in side contact with the connection member and a plurality of second conductive layers which is divided from the first conductive layer to vertically extend.

The second conductive layers may be disposed below a switching and/or sensing transistor among the transistor, below the substrate.

The first conductive layer may be applied with the low potential power voltage from the flexible film, by the power line.

The connection member may be disposed from the side surface of the display panel to an upper edge to be electrically connected to a side surface of the first conductive layer and the upper surface of the conductive electrode.

The conductive layer may be formed of a transparent conductive material such as indium tin oxide (ITO), indium zinc oxide (IZO), indium gallium zinc oxide (IGZO), or zinc oxide (ZnO) or a doped amorphous silicon.

The display device may further include a back cover disposed above the display panel and a roller which is connected to the back cover to wind or unwind the back cover and the display panel.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
   a display panel having a display area and a non-display area, the display panel including a substrate;
   a transistor disposed above the substrate in the display area;
   a flexible film disposed on a side surface of the non-display area, the flexible film connected to the substrate;
   a connection member disposed from an outermost side surface of the display panel to an upper surface of the display panel and electrically connected to the flexible film; and
   a conductive layer disposed below the substrate, the conductive layer electrically connected to the connection member,
   wherein the connection member is structured to distribute a low potential power voltage from the flexible film to the conductive layer to offset positive charges trapped below the transistor.

2. The display device according to claim 1, further comprising:
   a barrier film disposed below the conductive layer.

3. The display device according to claim 1, further comprising:
   a support substrate disposed below the conductive layer.

4. The display device according to claim 3, wherein the side surface of the non-display area is a second side surface of the non-display area, the non-display area including a plurality of first side surfaces, and wherein the conductive layer is located inward from an edge of the substrate on the plurality of first side surfaces of the non-display area and the conductive layer extends to the edge of the substrate on the second side surface of the non-display area.

5. The display device according to claim 4, further comprising:
   an encapsulation substrate disposed above the substrate, wherein the conductive layer is located inward from an edge of the encapsulation substrate.

6. The display device according to claim 5, wherein the substrate includes polyimide and the support substrate includes glass.

7. The display device according to claim 5, wherein the support substrate includes:
   a first support substrate disposed opposite to the second side surface of the non-display area, the first support substrate having a first thickness; and a second support substrate disposed opposite to at least one of the plurality of first side surfaces of the non-display area, the second support substrate having a second thickness less than the first thickness.

8. The display device according to claim 7, wherein a side surface of the first support substrate aligns with the edge of the substrate and a side surface of the encapsulation substrate is located inward from the side surface of the first support substrate.

9. The display device according to claim 7, wherein a side surface of the second support substrate is located inward from the encapsulation substrate.

10. The display device according to claim 7, wherein a side surface of the conductive layer above the first support substrate aligns with the edge of the substrate on the second side surface of the non-display area and the conductive layer is located inward from the edge of the substrate on the plurality of first side surfaces of the non-display in contact with the second side surface.

11. The display device according to claim 7, wherein the conductive layer above the second support substrate is located inward from the edge of the substrate on the plurality of first side surfaces of the non-display area.

12. The display device according to claim 1, wherein the conductive layer is a transparent conductive material including one of: indium tin oxide (ITO), indium zinc oxide (IZO), indium gallium zinc oxide (IGZO), or zinc oxide (ZnO) or a doped amorphous silicon.

13. A display device, comprising:
a display panel having a display area and a non-display area, the display panel including a substrate;
a transistor disposed on the substrate in the display area, the transistor having a gate electrode;
a plurality of flexible films disposed on the non-display area, the plurality of flexible films connected to the substrate;
a power line disposed on an upper surface of the display panel and connected to at least one of the plurality of flexible films;
a conductive electrode disposed on the upper surface of the display panel between the plurality of flexible films, the conduct electrode connected to the power line; and
a conductive layer disposed on the substrate,
wherein during operation, the conductive layer is applied with a voltage by the plurality of flexible films, the power line, and the conductive electrode that is equal to a voltage applied to the gate electrode of the transistor.

14. The display device according to claim 13, further comprising:
a back cover disposed above the display panel; and
a roller coupled to the back cover, the roller structured to wind or unwind the back cover and the display panel.

15. A display device, comprising:
a display panel having a display area and a non-display area, the display panel including a substrate;
a transistor disposed on the substrate in the display area, the transistor having a gate electrode;
a plurality of flexible films disposed on the non-display area, the plurality of flexible films connected to the substrate;
a conductive layer disposed on the substrate, wherein during operation, the conductive layer is applied with a voltage equal to a voltage applied to the gate electrode of the transistor;
a power line disposed on an upper surface of the display panel and connected to the plurality of flexible films, wherein during operation, the power line is applied with the voltage;
a conductive electrode disposed on the upper surface of the display panel between the plurality of flexible films, the conductive electrode connected to the power line; and
a connection member disposed from a side surface of the display panel to the upper surface of the display panel to cover an upper surface of the conductive electrode.

16. The display device according to claim 15, wherein the connection member is electrically connected to a side surface of the conductive layer and the upper surface of the conductive electrode.

17. The display device according to claim 15, wherein the conductive layer includes:
a first conductive layer disposed on one side surface of the non-display area in contact with the connection member; and
a plurality of second conductive layers separated from the first conductive layer and extending vertically.

18. The display device according to claim 17, wherein the transistor includes a switching transistor or a sensing transistor, or both, and the plurality of second conductive layers are disposed below the substrate and below the switching transistor or the sensing transistor, or below both the switching transistor and the sensing transistor.

19. The display device according to claim 17, wherein during operation, the first conductive layer is applied with the voltage from the plurality of flexible films by the power line.

20. The display device according to claim 17, wherein the connection member is disposed from the side surface of the display panel to an upper edge of the display panel, the connection member electrically connected to a side surface of the first conductive layer and the upper surface of the conductive electrode.

* * * * *